(12) United States Patent
Furukawa et al.

(10) Patent No.: US 12,300,716 B2
(45) Date of Patent: May 13, 2025

(54) SEMICONDUCTOR DEVICE AND POWER CONVERSION DEVICE

(71) Applicant: Hitachi Power Semiconductor Device, Ltd., Hitachi (JP)

(72) Inventors: Tomoyasu Furukawa, Tokyo (JP); Masaki Shiraishi, Tokyo (JP); So Watanabe, Tokyo (JP); Tomoyuki Miyoshi, Tokyo (JP); Yujiro Takeuchi, Tokyo (JP)

(73) Assignee: HITACHI POWER SEMICONDUCTOR DEVICE, LTD., Ibaraki (JP)

( * ) Notice: Subject to any disclaimer, the term of this patent is extended or adjusted under 35 U.S.C. 154(b) by 589 days.

(21) Appl. No.: 17/626,883

(22) PCT Filed: Apr. 22, 2020

(86) PCT No.: PCT/JP2020/017346
§ 371 (c)(1),
(2) Date: Jan. 13, 2022

(87) PCT Pub. No.: WO2021/049090
PCT Pub. Date: Mar. 18, 2021

(65) Prior Publication Data
US 2022/0278194 A1    Sep. 1, 2022

(30) Foreign Application Priority Data

Sep. 13, 2019   (JP) .................................. 2019-166780

(51) Int. Cl.
*H01L 29/06* (2006.01)
*H01L 29/10* (2006.01)
(Continued)

(52) U.S. Cl.
CPC ........ *H01L 29/063* (2013.01); *H01L 29/0623* (2013.01); *H01L 29/1095* (2013.01);
(Continued)

(58) Field of Classification Search
CPC .............. H01L 29/063; H01L 29/0623; H01L 29/1095; H01L 29/407; H01L 29/7397;
(Continued)

(56) References Cited

U.S. PATENT DOCUMENTS 10,008,592 B1 * 6/2018 Kojima ............... H01L 29/1095
10,600,897 B2 * 3/2020 Shirakawa .......... H01L 29/0696
(Continued)

FOREIGN PATENT DOCUMENTS

CN          107210299 A      9/2017
CN          109075192 A     12/2018
(Continued)

OTHER PUBLICATIONS

Extended European Search Report, mailed Sep. 15, 2023, for European Application No. 20862024.5.
(Continued)

*Primary Examiner* — Khaja Ahmad
*Assistant Examiner* — Khatib A Rahman
(74) *Attorney, Agent, or Firm* — Baker Botts L.L.P.

(57) ABSTRACT

A semiconductor device having a high cutoff resistance capable of suppressing local current/electric field concentration and current concentration at a chip termination portion due to an electric field variation between IGBT cells due to a shape variation and impurity variation during manufacturing. The semiconductor device is characterized by including an emitter electrode formed on a front surface of a semiconductor substrate via an interlayer insulating film, a collector electrode formed on a back surface of the semiconductor substrate, a first semiconductor layer of a
(Continued)

first conductivity type in contact with the collector electrode, a second semiconductor layer of a second conductivity type, a central area cell, and an outer peripheral area cell located outside the central area cell.

8 Claims, 20 Drawing Sheets

(51) Int. Cl.
    *H01L 29/40*     (2006.01)
    *H01L 29/739*     (2006.01)
    *H02M 7/00*     (2006.01)
    *H02M 7/5387*     (2007.01)

(52) U.S. Cl.
    CPC ........ *H01L 29/407* (2013.01); *H01L 29/7397* (2013.01); *H02M 7/003* (2013.01); *H02M 7/5387* (2013.01)

(58) Field of Classification Search
    CPC ............... H01L 29/0696; H01L 29/417; H01L 29/42376; H02M 7/003; H02M 7/5387
    See application file for complete search history.

(56) References Cited

U.S. PATENT DOCUMENTS

| | | | |
|---|---|---|---|
| 11,251,177 B2* | 2/2022 | Takano | ........... H01L 21/823418 |
| 2011/0108911 A1 | 5/2011 | Matsuoka | |
| 2015/0340441 A1 | 11/2015 | Iwamuro et al. | |
| 2017/0213886 A1 | 7/2017 | Iwanuro et al. | |
| 2017/0352747 A1 | 12/2017 | Sumitomo | |
| 2018/0047721 A1* | 2/2018 | Nishimura | .......... H01L 29/8613 |
| 2018/0308972 A1 | 10/2018 | Ohse et al. | |
| 2018/0337233 A1 | 11/2018 | Naito | |
| 2019/0019885 A1* | 1/2019 | Naito | .................... H01L 29/739 |
| 2019/0140084 A1* | 5/2019 | Shirakawa | .......... H01L 29/0649 |
| 2019/0312105 A1* | 10/2019 | Sakurai | ............... H01L 29/7397 |
| 2022/0149163 A1* | 5/2022 | Ebihara | ............. H01L 29/41741 |

FOREIGN PATENT DOCUMENTS

| | | |
|---|---|---|
| JP | 2003-133556 A | 5/2003 |
| JP | 2011-100877 A | 5/2011 |
| JP | 2012-043890 A | 3/2012 |
| JP | 2016-012581 A | 1/2016 |
| JP | 2016-184712 A | 10/2016 |
| JP | 2018-195798 A | 12/2018 |

OTHER PUBLICATIONS

International Search Report, mailed Jul. 7, 2020, for International Application No. PCT/JP2020/017346.

Office Action, dated May 19, 2021, for Taiwanese Application No. 109122447.

Notice of Allowance, issued Feb. 12, 2025, for Chinese Application No. 202080061875.6 (with partial English translation).

* cited by examiner

SEMICONDUCTOR DEVICE AND POWER CONVERSION DEVICE

TECHNICAL FIELD

The present invention relates to a structure of a semiconductor device, and particularly to an effective technique applied to an insulated gate bipolar transistor (IGBT) mounted in a power conversion device.

BACKGROUND ART

An insulated gate bipolar transistor module (hereinafter referred to as IGBT), which is a main component of a power converter such as an inverter, is required to be reduced in cost and size. Similarly, a power device chip in a power module is also required to be reduced in cost and size, and a new technique for realizing a high output current density of an IGBT chip is required.

When the high output current density is reached, the loss per unit chip area of the power device increases, and a chip temperature increases. For this reason, it is necessary for the IGBT chip to expand a safe operating area (Reverse Bias Safe Operating Area: hereinafter referred to as RBSOA) at the time of turn-off at a high output current. That is, it is necessary that the IGBT is not broken even at a higher current, voltage, or temperature, and has sufficient current cutoff resistance.

In such a background, as a technique for improving the current cutoff capability, for example, PTL 1 proposes a technique of reducing hole injection of a p-type collector layer of a peripheral guard ring portion of an IGBT chip and suppressing current concentration in a cell portion acting as an active area. As a result, a parasitic bipolar transistor operation of an IGBT cell due to the current concentration can be suppressed, and the current cutoff capability can be improved.

In addition, PTL 2 proposes a configuration in which the avalanche resistance of a termination area is higher than that of an IGBT cell by removing a trench structure in the termination area of an IGBT chip and making an opening area of a contact hole in the termination area equal to or smaller than a central portion. Accordingly, it is possible to suppress electric field concentration at a termination portion, and to improve RBSOA without breaking the element even when a high surge voltage is generated.

In addition, PTL 3 proposes a technique in which an electric field concentration area formed by a PN junction is provided in a central portion between trenches of an IGBT cell, and electron injection by impact ionization at the time of turn-off is uniformly generated between cells, so that current concentration is suppressed, and cutoff resistance is improved.

CITATION LIST

Patent Literature

PTL 1: JP-A-2003-133556
PTL 2: JP-A-2011-100877
PTL 3: JP-A-2016-012581

SUMMARY OF INVENTION

Technical Problem

However, in the related art of PTL 1 and PTL 2, when an electric field variation between a plurality of IGBT cells caused by a shape variation or impurity variation during manufacturing of the IGBT cell occurs, the current/electric field concentration may occur in a cell having a strong electric field, and the cutoff resistance may decrease.

In addition, in the related art of PTL 3, a hall current from the chip termination portion may be concentrated on a chip outer peripheral cell or a cell of a chip corner portion, which may hinder improvement in the cutoff resistance.

Therefore, an object of the invention is to provide a semiconductor device having a high cutoff resistance capable of suppressing local current/electric field concentration and current concentration at a chip termination portion due to an electric field variation between IGBT cells due to a shape variation and impurity variation during manufacturing and a power conversion device using the semiconductor device.

Solution to Problem

In order to solve the above problems, the invention provides a semiconductor device including: an emitter electrode formed on a front surface of a semiconductor substrate via an interlayer insulating film; a collector electrode formed on a back surface of the semiconductor substrate; a first semiconductor layer of a first conductivity type in contact with the collector electrode and formed on the back surface of the semiconductor substrate; a second semiconductor layer of a second conductivity type formed inside the first semiconductor layer; a central area cell disposed along a front surface of the semiconductor substrate; and an outer peripheral area cell located outside the central area cell in a planar direction of the semiconductor substrate and disposed between the central area cell and the chip termination guard ring area, wherein the central area cell includes: a trench formed between the emitter electrode and the semiconductor substrate; a gate electrode formed inside the trench via a gate insulating film and insulated from the emitter electrode via the interlayer insulating film; a third semiconductor layer of a second conductivity type formed in contact with the gate insulating film and having a higher impurity concentration than the semiconductor substrate; a fourth semiconductor layer of a first conductivity type formed in contact with a semiconductor substrate side of the emitter electrode via an emitter contact and having a higher impurity concentration than the first semiconductor layer; a fifth semiconductor layer of a first conductivity type in contact with the gate insulating film, formed on the semiconductor substrate side of the second semiconductor layer, and having a lower impurity concentration than the fourth semiconductor layer; a sixth semiconductor layer of a first conductivity type in contact with a front surface of the fourth semiconductor layer on the semiconductor substrate side, formed so as to project from the fifth semiconductor layer toward the semiconductor substrate side, and having a lower carrier concentration than the fourth semiconductor layer; and a seventh semiconductor layer of a second conductivity type formed in contact with a front surface of the sixth semiconductor layer on a collector electrode side and having a higher impurity concentration than the semiconductor substrate; and the outer peripheral area cell includes the trench, the gate electrode, the fourth semiconductor layer, the fifth semiconductor layer, and the sixth semiconductor layer, and the outer peripheral area cell does not include at least one of the third semiconductor layer and the seventh semiconductor layer.

In addition, the invention is characterized in that a power conversion device including: a pair of DC terminals; the same number of AC terminals as the number of phases of AC; and a switching leg that is connected between the pair of DC terminals and in which two parallel circuits of a switching element and a diode of opposite polarity are connected in series, wherein an interconnection point of parallel circuits constitutes the same number of power conversion units as the number of phases of AC connected to different AC terminals, and the switching element is the semiconductor device described above.

Advantageous Effect

According to the invention, the semiconductor device having a high cutoff resistance capable of suppressing local current/electric field concentration and current concentration at a chip termination portion due to an electric field variation between IGBT cells due to a shape variation and impurity variation during manufacturing and a power conversion device using the semiconductor device can be realized.

Thereby, it is possible to increase the current density of the IGBT chip, and to contribute to the miniaturization of the power conversion device in which the IGBT chip is mounted.

Problems, configurations and effects other than those described above will be clarified by description of the following embodiments.

DESCRIPTION OF EMBODIMENTS

Figure 1A:
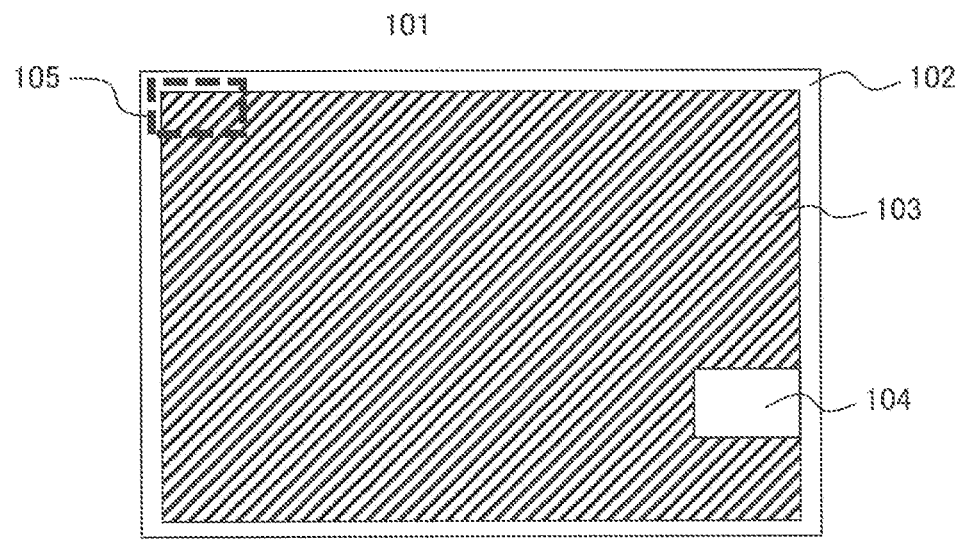
FIG. 1A is a top view of an IGBT semiconductor chip according to a first embodiment of the invention.

Hereinafter, embodiments of the invention will be described in detail with reference to the drawings. In the drawings, those having the same reference numerals indicate the same constituent elements or constituent elements having similar functions. In addition, p−, p, and p+ indicate that a conductive type of a semiconductor layer is a p type, and relative impurity concentrations increase in this order. Furthermore, n−, n, and n+ indicate that a conductive type of the semiconductor layer is an n type, and relative impurity concentrations increase in this order.

First Embodiment

Figure 6:
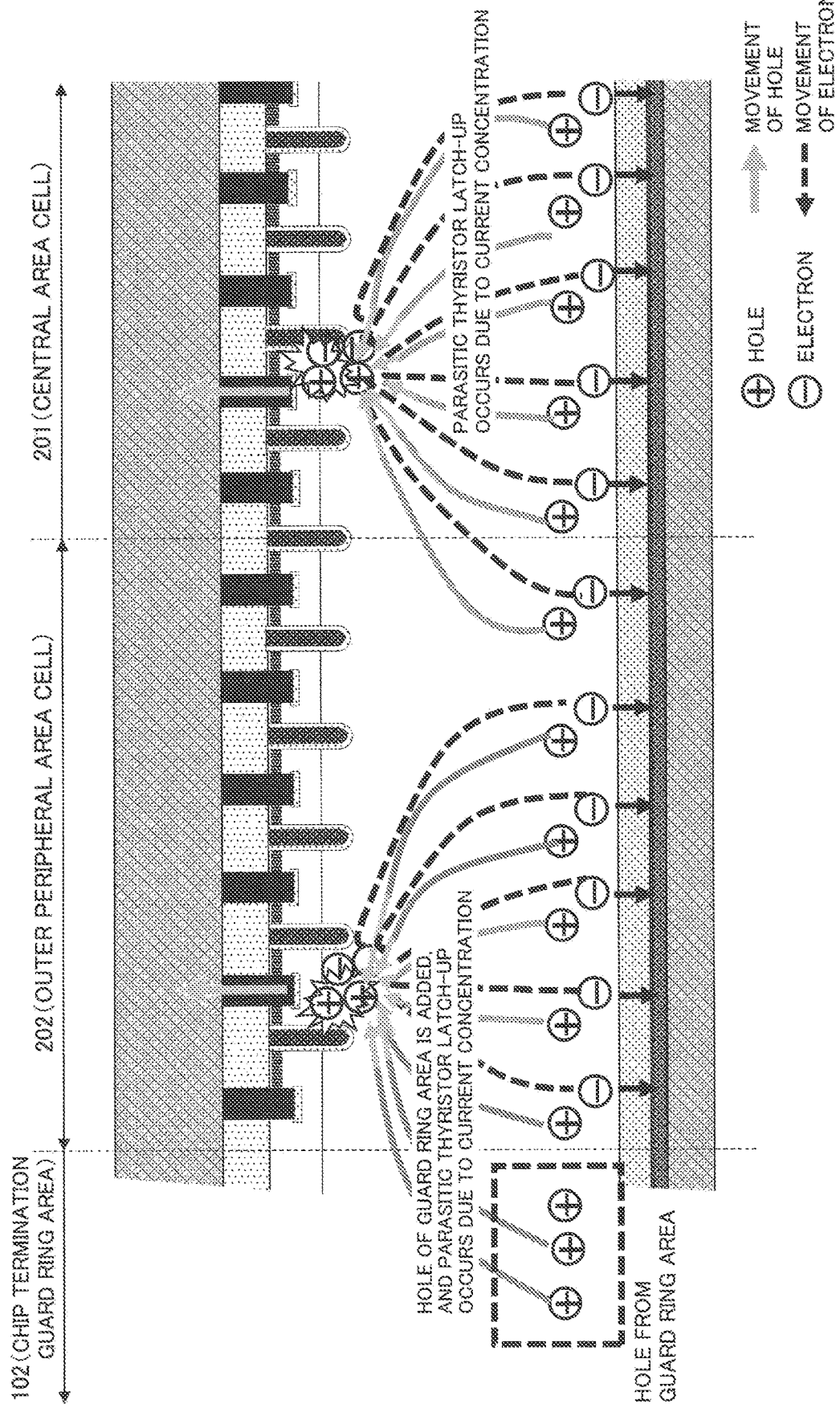
FIG. 6 is a schematic view showing an internal state of the IGBT semiconductor chip of the related art during turn-off.
Figure 7:
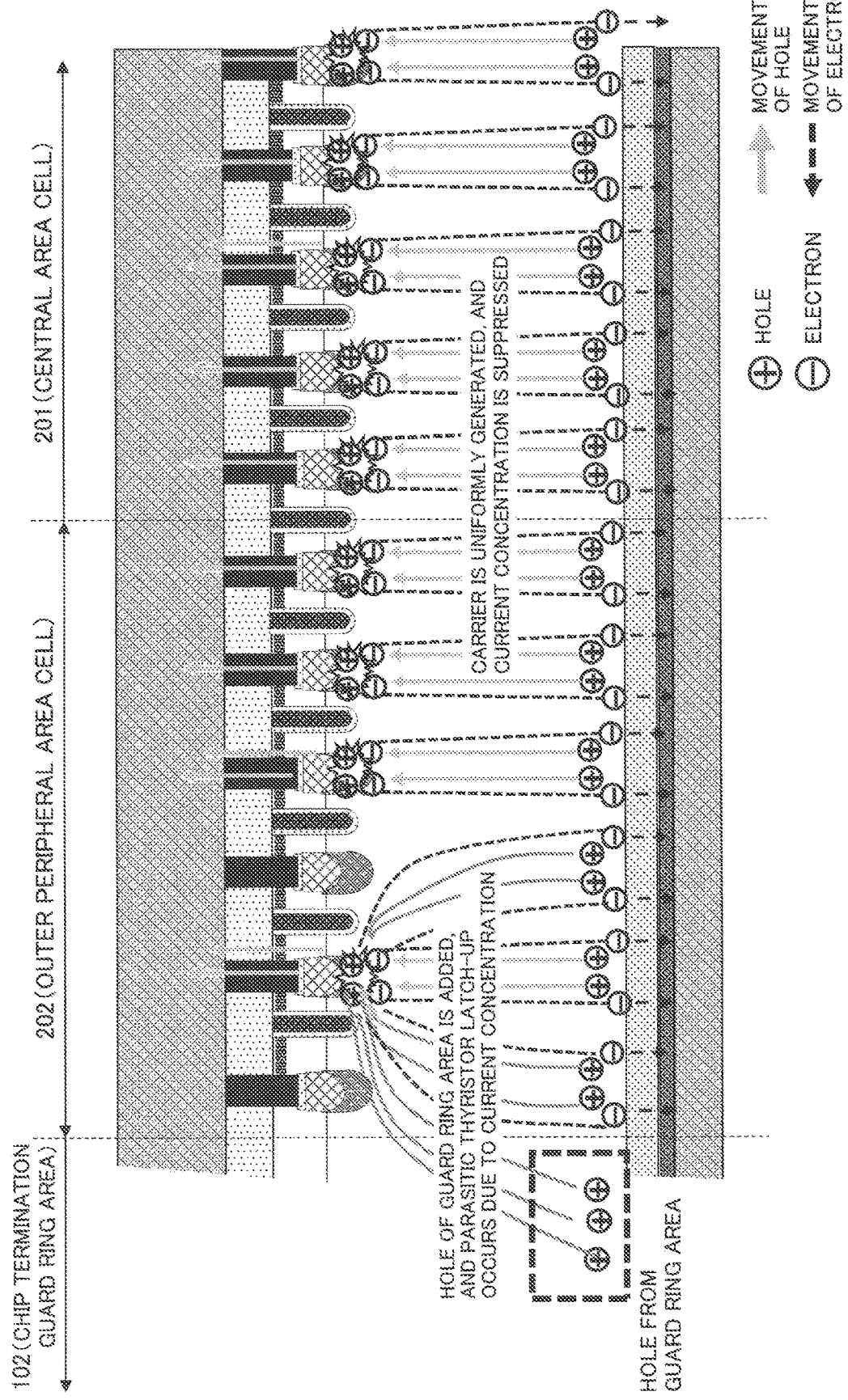
FIG. 7 is a schematic view showing the internal state of the IGBT semiconductor chip of the related art during turn-off.

A semiconductor device of a first embodiment of the invention and a manufacturing method thereof will be described with reference to FIGS. 1A to 9. FIGS. 3, 6, and 7 are diagrams showing an IGBT semiconductor chip of the related art shown as a comparative example in order to make the invention easy to understand.

FIG. 1A is a top view of an IGBT semiconductor chip 101. A cell area 103 in which a plurality of unit cells of the IGBT are disposed is provided in the center of the chip. In addition, a gate electrode PAD 104 for applying a gate voltage of the IGBT is provided. In addition, a chip termination guard ring area 102 is provided on an outer periphery of the IGBT semiconductor chip 101.

Figure 1B:
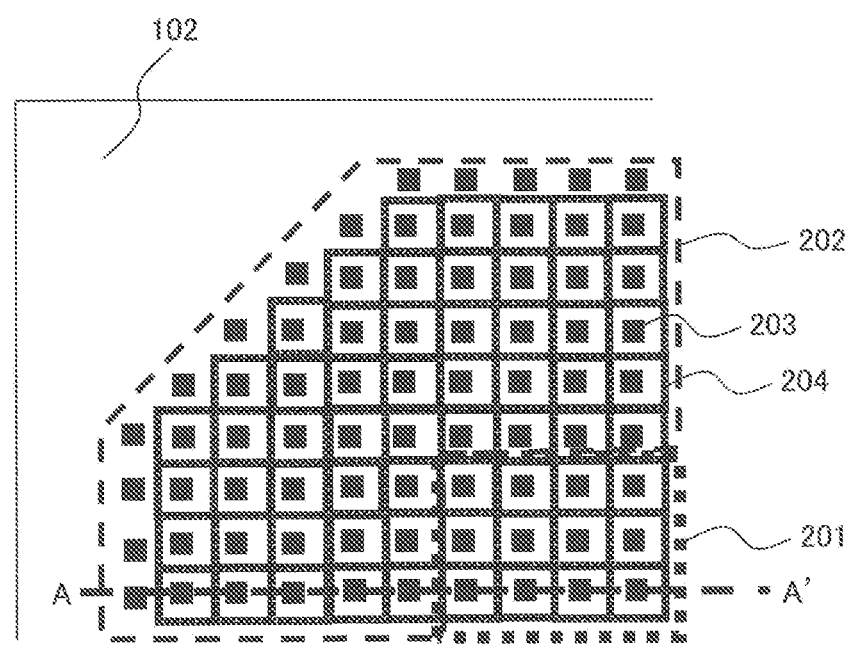
FIG. 1B is an enlarged view of a cell termination area 105 of FIG. 1A.

FIG. 1B is an enlarged view of a cell termination area 105 of the IGBT semiconductor chip 101, and is a schematic view showing a surface structure without an emitter electrode. In the cell area 103, a plurality of unit cells in which a trench gate 204 is periodically disposed are disposed, and an emitter contact 203 is provided in a central portion of each unit cell. The unit cell is provided with a central area cell 201 of the IGBT semiconductor chip 101, and an outer peripheral area cell 202 located outside the central area cell 201 in the planar direction of the IGBT semiconductor chip 101 and between the central area cell 201 and the chip termination guard ring area 102.

Figure 2:
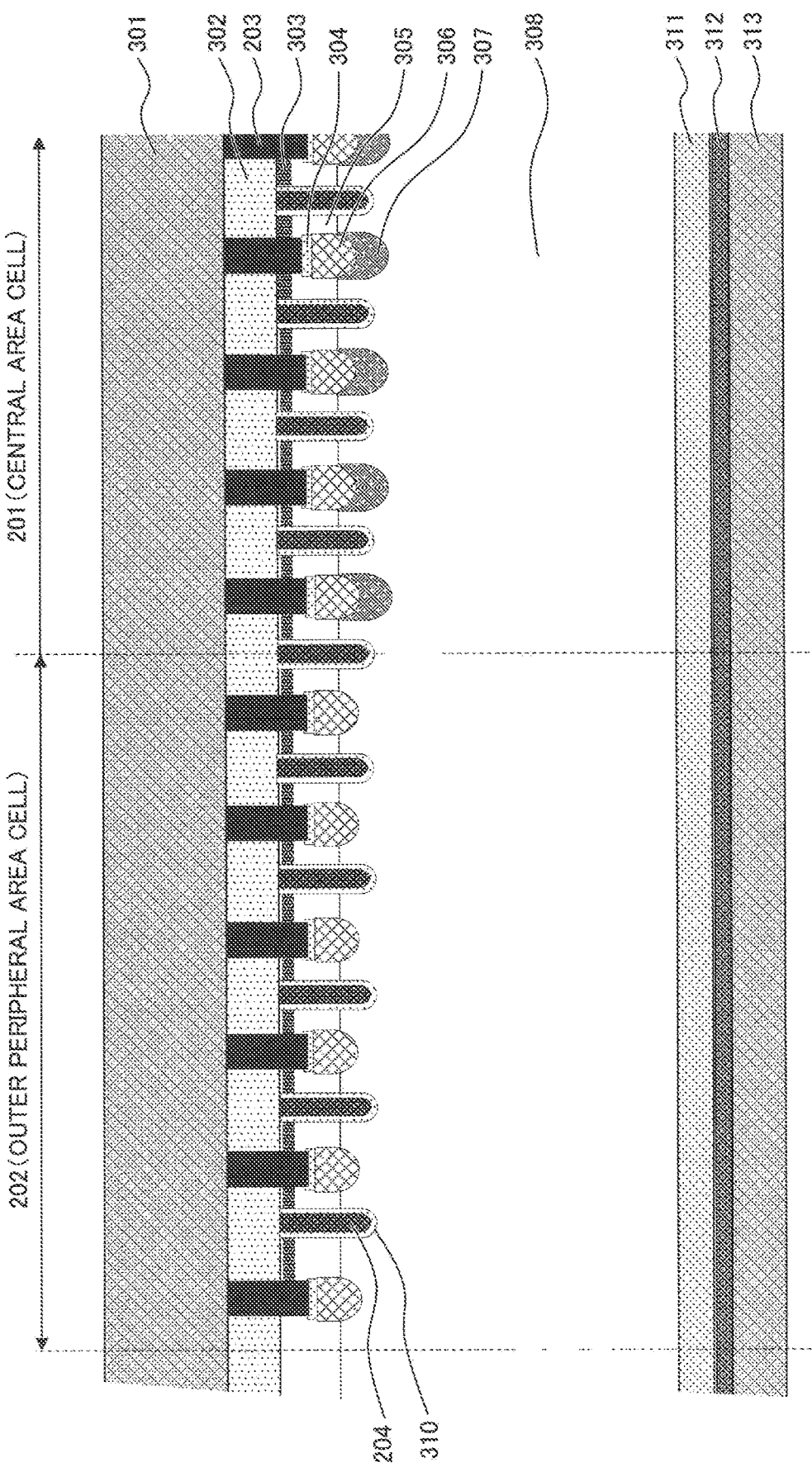
FIG. 2 is a cross-sectional view taken along a line A-A' of FIG. 1B.
Figure 3:
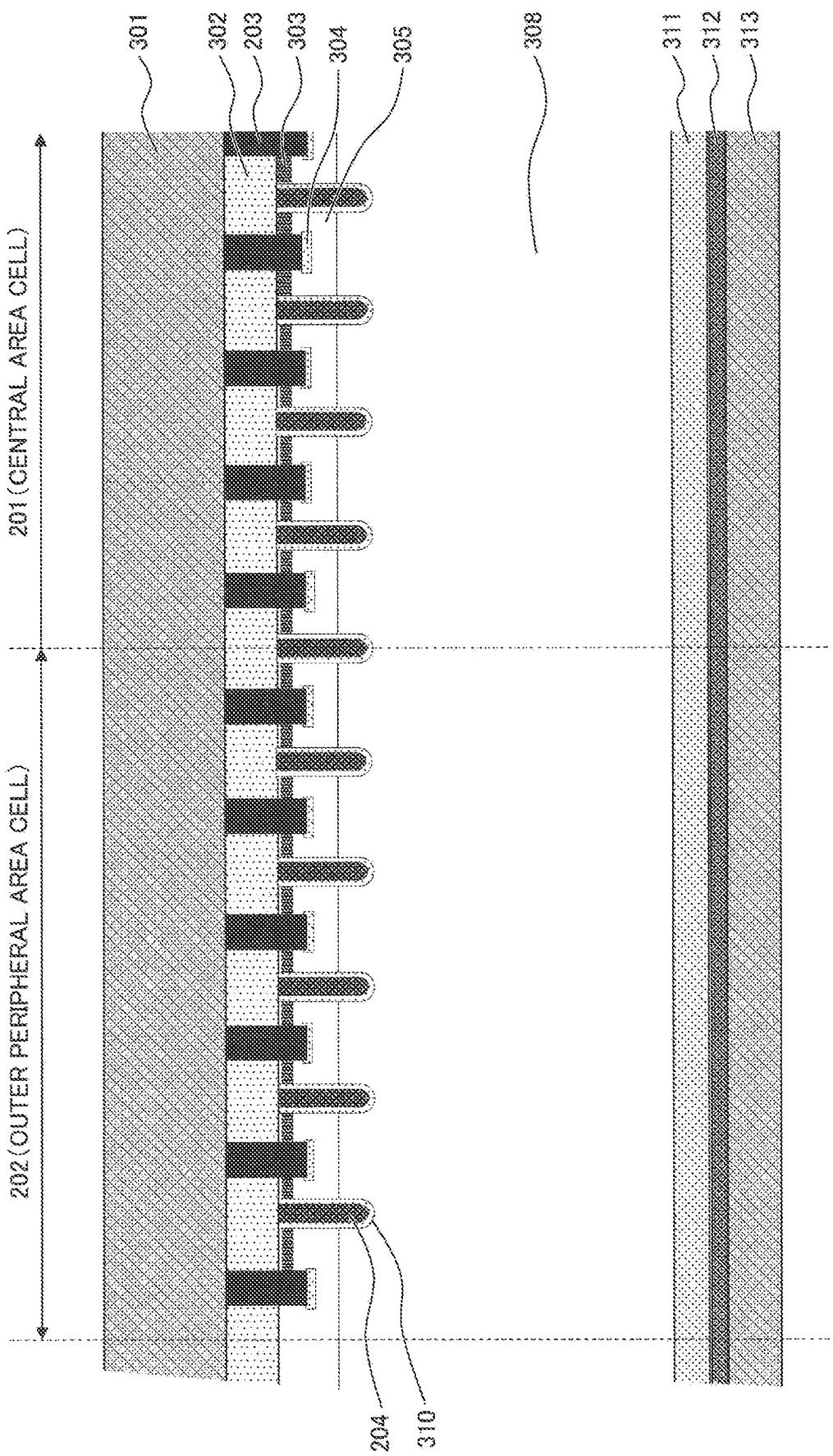
FIG. 3 is a cross-sectional view of an IGBT semiconductor chip of the related art.

FIG. 2 is a cross-sectional view taken along a line A-A' of FIG. 1B. The central area cell 201 is formed to include a trench (reference numeral 501 in FIG. 4 to be described later) formed between an emitter electrode 301 and a semiconductor substrate 308, a gate electrode (the trench gate 204) formed inside the trench and insulated from the emitter electrode 301 via an insulating layer (an interlayer insulating film 302), a gate insulating film 310 formed in the trench, a third semiconductor layer (an n+ source layer) 303 of a second conductivity type formed in contact with the gate insulating film 310 and having a higher impurity concentration than the semiconductor substrate 308, a fourth semiconductor layer (a shallow p+ layer) 304 of a first conductivity type formed in contact with the front surface of the emitter electrode 301 on the semiconductor substrate 308 side via the emitter contact 203 and having the higher impurity concentration than a first semiconductor layer (a p-type collector layer) 312, a fifth semiconductor layer (a p base layer) 305 of a first conductivity type in contact with the gate insulating film 310, formed on the semiconductor substrate 308 side of the third semiconductor layer (an n+ source layer) 303, and having a lower impurity concentration than the fourth semiconductor layer (the shallow p+ layer) 304, a sixth semiconductor layer (a deep p+ layer) 306 of a first conductivity type in contact with a front surface of the fourth semiconductor layer (the shallow p+ layer) 304 on the semiconductor substrate 308 side, formed so as to project from the fifth semiconductor layer (the p base layer) 305 toward the semiconductor substrate 308 side, and having a lower carrier concentration than the fourth semiconductor layer (shallow p+ layer) 304, and a seventh semiconductor layer (a deep n layer) 307 of a second conductivity type formed in contact with a front surface of the sixth semiconductor layer (the deep p+ layer) 306 on a collector electrode 313 side and having a higher impurity concentration than the semiconductor substrate 308.

The outer peripheral area cell 202 outside the central area cell 201 in the plane direction of the IGBT semiconductor chip 101 is formed with the trench (reference numeral 501 in FIG. 4 to be described later) formed between the emitter electrode 301 and the semiconductor substrate 308, the gate electrode (the trench gate 204) formed inside the trench and insulated from the emitter electrode 301 via the insulating layer (the interlayer insulating film 302), the gate insulating film 310 formed in the trench, the third semiconductor layer (the n+ source layer) 303 of a second conductivity type formed in contact with the gate insulating film 310 and having a higher impurity concentration than the semiconductor substrate 308, the fourth semiconductor layer (the shallow p+ layer) 304 of a first conductivity type formed in contact with the front surface of the emitter electrode 301 on the semiconductor substrate 308 side and having a higher impurity concentration than the first semiconductor layer (the p-type collector layer) 312, the fifth semiconductor layer (the p base layer) 305 of a first conductivity type in contact with the gate insulating film 310, formed on the semiconductor substrate 308 side of the third semiconductor layer (the n+ source layer) 303, and having a lower impurity concentration than the fourth semiconductor layer (the shallow p+ layer) 304, and the sixth semiconductor layer (the deep p+ layer) 306 of a first conductivity type in contact with the front surface of the fourth semiconductor layer (the shallow p+ layer) 304 on the semiconductor substrate 308 side, formed so as to project from the fifth semiconductor layer (the p base layer) 305 toward the semiconductor substrate 308 side, and having a lower carrier concentration than the fourth semiconductor layer (the shallow p+ layer) 304.

Figure 4:
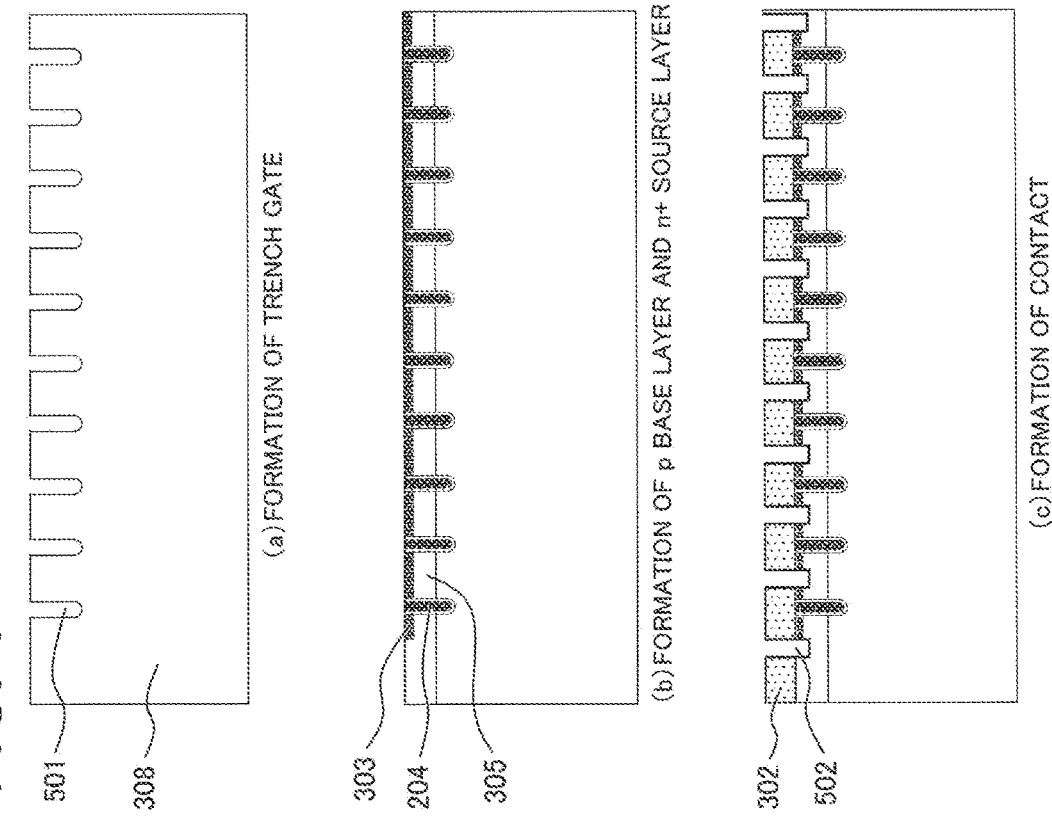
FIG. 4 is a diagram showing a manufacturing process of the IGBT semiconductor chip according to the first embodiment of the invention.

FIG. 4 is a diagram showing a manufacturing process of the IGBT semiconductor chip 101 of the present embodiment (FIG. 2).

<(a) Formation of Trench Gate>

First, an n− semiconductor substrate 308 (for example, a semiconductor wafer such as a Si wafer) is prepared.

Next, an insulating film (for example, $SiO_2$) formed on the n− semiconductor substrate 308 is patterned for trench formation by photolithography.

Next, the trenches 501 are formed by anisotropic etching by using the patterned insulating film as a mask.

<(b) Formation of P Base Layer and N+ Source Layer>

Next, a gate insulating film is formed, a polysilicon film is deposited, and after exposure by photolithography, the trench gate 204 is processed and formed.

Next, by performing ion implantation of p-type impurities by using a photoresist patterned for forming the p base layer 305 as a mask, and further performing heat treatment, the fifth semiconductor layer (the p base layer) 305 is formed.

Subsequently, ion implantation of n-type impurities is performed by using a photoresist patterned for forming the n+ source layer 303 as a mask, and the third semiconductor layer (n+ source layer) 303 is formed.

<(c) Formation of Contact>

Next, the interlayer insulating film 302 is deposited on the entire surface of the n− semiconductor substrate 308. Planarization is performed on the interlayer insulating film 302. For the planarization, for example, a planarization method such as reflow of a boron-phosphate glass (BPSG) film or chemical mechanical polishing (CMP) is applied.

After the planarization of the interlayer insulating film 302, contact holes 502 are formed by photolithography and anisotropic etching. In this case, the contact holes 502 penetrate the interlayer insulating film 302 and further reach the fifth semiconductor layer (the p base layer) 305. As a result, when the p base layer 305 is viewed in cross section, a pair of n+ source layers are formed, and a groove in contact with a contact metal layer formed in the subsequent step is formed.

<(d) Formation of Shallow P Layer and Deep P Layer>

Subsequently, ion implantation of the shallow p+ layer 304 and the deep p+ layer 306 is performed in this order by using the interlayer insulating film 302 as a mask, and the fourth semiconductor layer (the shallow p+ layer) 304 and the sixth semiconductor layer (the deep p+ layer) 306 are formed.

<(e) Formation of Deep N+ Layer>

Next, a resist 503 is applied to the entire surface of the n− semiconductor substrate 308, the resist 503 is opened only in the central area by photolithography, the seventh semiconductor layer (the deep n layer) 307 is formed by ion implantation, and after the resist is removed, the p+ contact and the n+ source contact are formed in self-alignment with respect to the contact hole 502 by performing heat treatment.

<(f) Formation of Emitter Electrode, Back Surface N Buffer, P Collector Layer, and Collector Electrode>

Next, the contact hole 502 is filled with a laminated metal film made of a high melting point metal such as Ti, TiN, and W and further planarized by etching or CMP, thereby forming the contact metal layer (the emitter contact 203). Thereafter, a metal layer made of aluminum or the like is deposited, and the emitter electrode 301 and the gate electrode PAD 104 (not shown) are formed by photolithography and etching. Thereafter, although not shown, a surface protective film made of polyimide or the like is formed and patterned.

The above steps are the processing of a front surface side of the semiconductor substrate 308.

Then, by performing ion implantation of the n-type and p-type impurities from a back surface side of the semiconductor substrate 308 on the semiconductor substrate 308 and further performing laser annealing, the second semiconductor layer (the n-type buffer layer) 311 and the first semiconductor layer (the p-type collector layer) 312 are formed.

By appropriately adjusting acceleration energy at the time of ion implantation, the n-type buffer layer 311 and the p-type collector layer 312 having different depths from the back surface of the semiconductor substrate 308 can be formed. Thereafter, a laminated metal layer, for example, Al—Ti—Ni—Au is formed by sputtering on the back surface side of the semiconductor substrate 308, and the collector electrode 313 is formed.

The feature of the first embodiment is that in the central area cell 201 in the planar direction of the IGBT semiconductor chip 101, a pn junction in which the electric field is easily concentrated in the sixth semiconductor layer 306 and the seventh semiconductor layer 307 is formed, and the cell (the outer peripheral area cell 202) outside the planar direction of the central area cell 201 in the planar direction of the IGBT semiconductor chip 101 has a structure in which the seventh semiconductor layer 307 is not included as compared with the central cell area 201. This effect is that the cutoff resistance at the time of turn-off is improved. The principle thereof will be described below.

Figure 5:
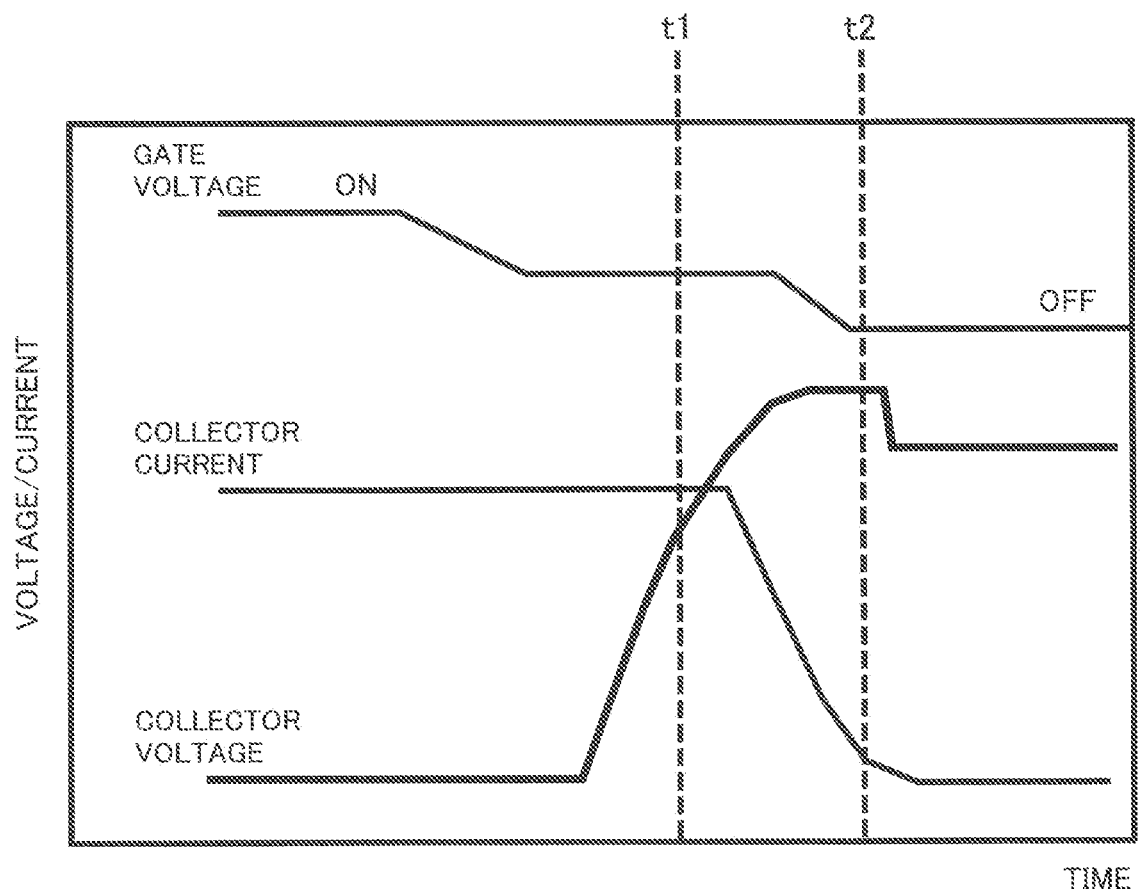
FIG. 5 is a diagram showing a turn-off waveform (a normal waveform) of the IGBT semiconductor chip.

FIG. 5 is an example of a turn-off waveform of the IGBT semiconductor chip. At the time of turn-off of the IGBT semiconductor chip, when the gate voltage becomes equal to or lower than a threshold voltage, active electron injection from the trench gate disappears, and thus the path of a hall current becomes unstable (easy to move). In this case, a portion where the electric field is slightly strong is inevitably generated locally due to variations in the dimension, shape, and the like of the trench. In such a portion, since the electron injection by the impact ionization is relatively large, the hall current starts to be concentrated.

Figure 8:
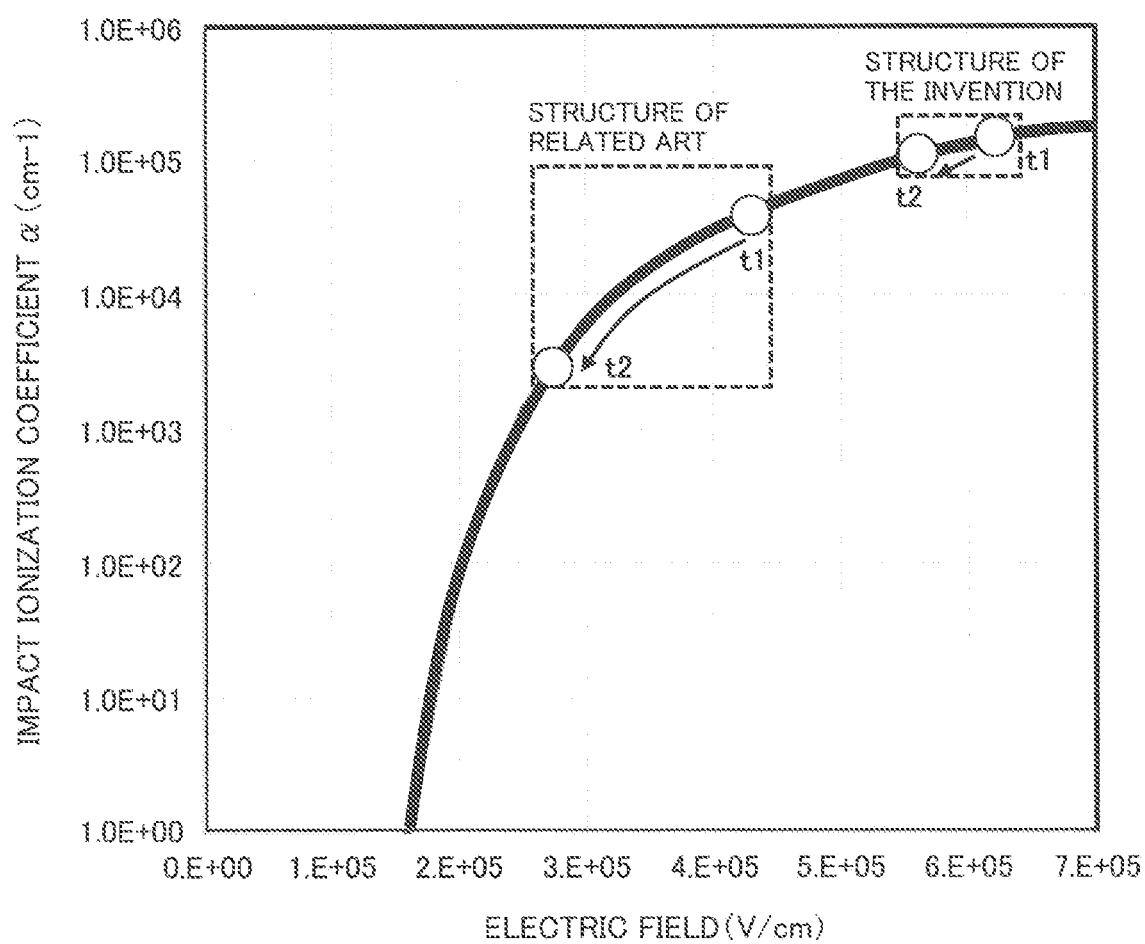
FIG. 8 is a diagram showing changes in an impact ionization coefficient α and an electric field of the IGBT semiconductor chip during turn-off.

FIG. 8 shows a relation between the changes in an impact ionization coefficient α and the electric field during turn-off of the related art and that of the invention. The impact ionization is strongly dependent on the electric field, and in the case of the related art shown in FIG. 3, there is no electric field concentration layer pn junction formed by the sixth semiconductor layer (the deep p+ layer) 306 and the seventh semiconductor layer (the deep n layer) 307 as in the present embodiment shown in FIG. 2, the electric field is low during a turn-off period t1 to t2, and thus the change in the impact ionization coefficient during the period t1 to t2 is large.

That is, there are few carriers that impacts ionize during turn-off. In such a case, as shown in FIG. 6, even when the electric field is slightly uneven locally due to the variations in the dimension, shape, and the like of the trench, a difference occurs in the impact ionization, and due to current concentration and local heat generation, latch-up occurs in which current flows through a parasitic thyristor (the n+ source/p base/n− substrate/p-type collector layer) and cannot be turned off, leading to thermal destruction and a decrease in the cutoff resistance at the time of turn-off.

Since the hall current from the chip termination guard ring area 102 is also added to the outer peripheral area cell 202, the current is further concentrated, which is a factor to reduce the cutoff resistance.

In the case of the IGBT semiconductor chip of the related art shown in FIG. 7, when the electric field concentrated pn junction is formed by the sixth semiconductor layer (the deep p+ layer) and the seventh semiconductor layer (the deep n layer) in the IGBT cell, the electric field during the turn-off period t1 to t2 is high, and the change in the impact ionization coefficient during the period t1 to t2 is small. Therefore, the electron injection by the impact ionization occurs uniformly between the cells, the hall current flows uniformly through the IGBT cells, and the current concentration is suppressed. For this reason, the cutoff resistance at the time of turn-off is improved.

However, since the seventh semiconductor layer (the deep n layer) is a barrier layer with respect to the hole, it is difficult for the hall current to escape in the cell with the seventh semiconductor layer (the deep n layer), and since the hall current from the chip termination guard ring area 102 is added to the outer peripheral area cell 202, the current concentration occurs, which further hinders improvement of the cutoff resistance.

Figure 9:
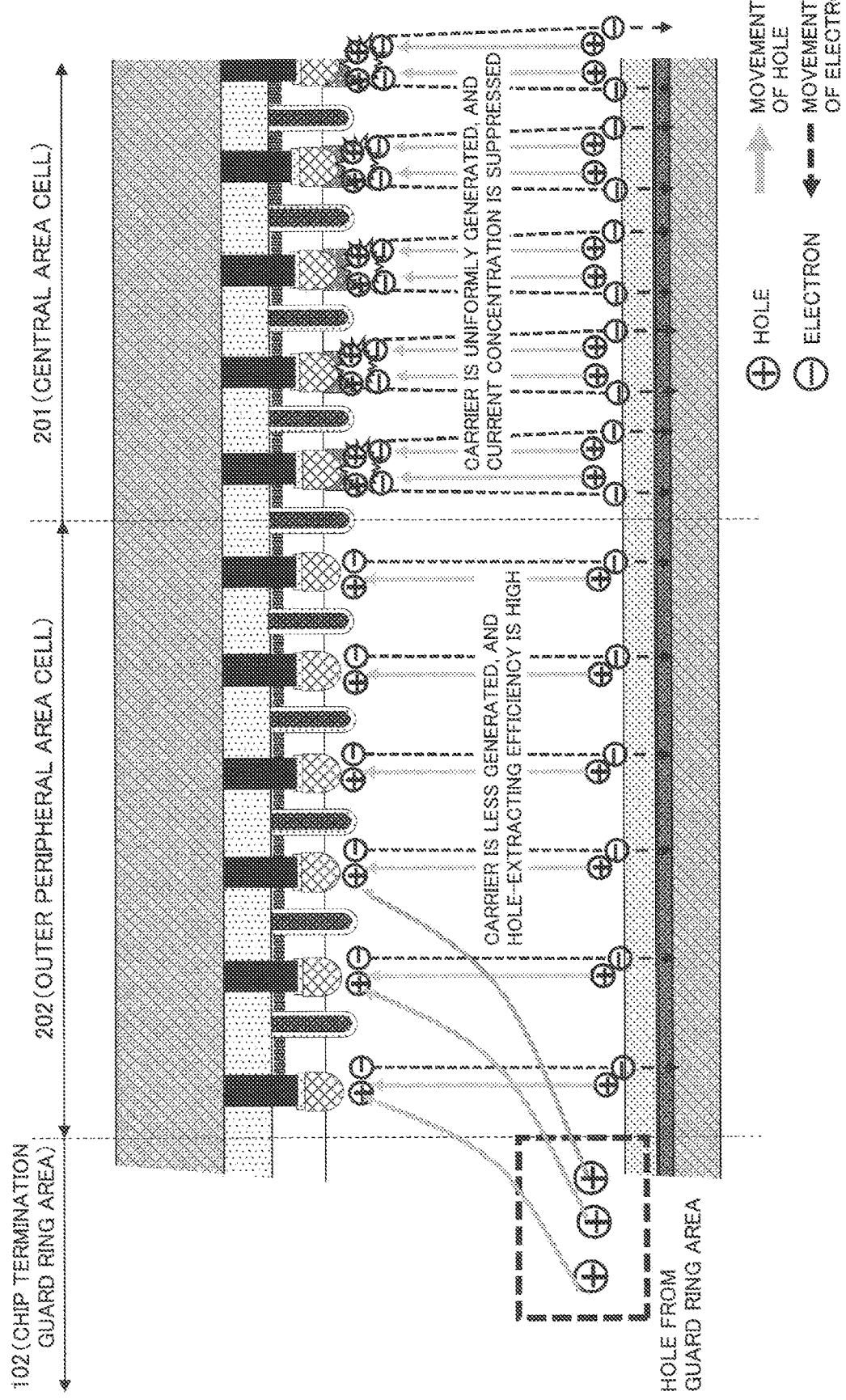
FIG. 9 is a schematic view showing an internal state of the IGBT semiconductor chip according to the first embodiment during turn-off.

Therefore, as shown in FIG. 9, the present embodiment has an effect that the central area cell 201 can form an electric field concentration pn junction by the sixth semiconductor layer (the deep p+ layer) and the seventh semiconductor layer (the deep n layer), uniformly generate electron injection by the impact ionization between the cells, equalize the hall current, and improve the cutoff resistance.

Meanwhile, the present embodiment has an effect that since the outer peripheral area cell 202 has a configuration in which the seventh semiconductor layer (the deep n layer) is not included, the hall current added from the chip termination guard ring area 102 can be efficiently extracted in the outer peripheral area cell 202, and thus the current concentration in the outer peripheral area cell 202 can be suppressed. As a result, it is possible to provide an IGBT semiconductor chip having excellent cutoff resistance.

Second Embodiment

Figure 10:
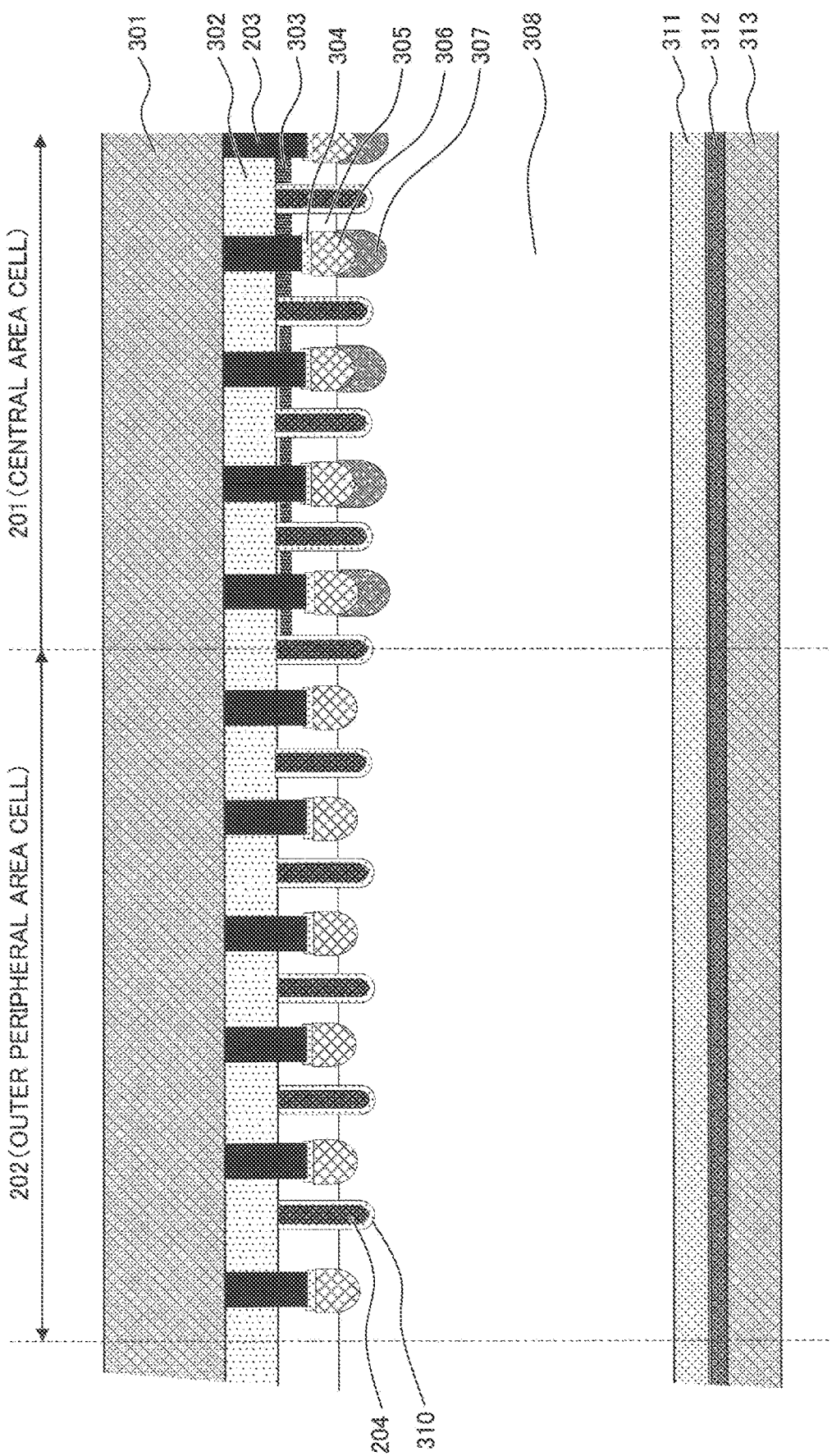
FIG. 10 is a cross-sectional view of an IGBT semiconductor chip according to a second embodiment of the invention.

A semiconductor device of a second embodiment of the invention will be described with reference to FIG. 10. FIG. 10 is a cross-sectional view of an IGBT semiconductor chip of the present embodiment, and corresponds to a modification of the first embodiment (FIG. 2).

The configuration of the central area cell 201 of the present embodiment is the same as that of the first embodiment (FIG. 2), and the repeated description will be omitted.

Meanwhile, the outer peripheral area cell 202 of the present embodiment is different from the configuration of the first embodiment (FIG. 2) in that the third semiconductor layer (the n+ source layer) 303 is not formed in the area between the emitter contact 203 and the gate insulating film 310. Therefore, in the area between the emitter contact 203 and the gate insulating film 310, the interlayer insulating film 302 is formed in contact with the front surface of the fifth semiconductor layer (the p-base layer) 305.

In the present embodiment, the configuration of the central area cell 201 is the same as that of the first embodiment (FIG. 9), and the same effect can be obtained.

Meanwhile, since the outer peripheral area cell 202 does not include the third semiconductor layer (the n+ source layer) 303 as compared with the first embodiment (FIG. 9), there is no parasitic thyristor (the n+ source/p base/n-substrate/p-type collector layer) structure, and further the latch-up can be prevented in addition to the effect of the first embodiment. As a result, it is possible to provide an IGBT semiconductor chip having excellent cutoff resistance.

Third Embodiment

Figure 11:
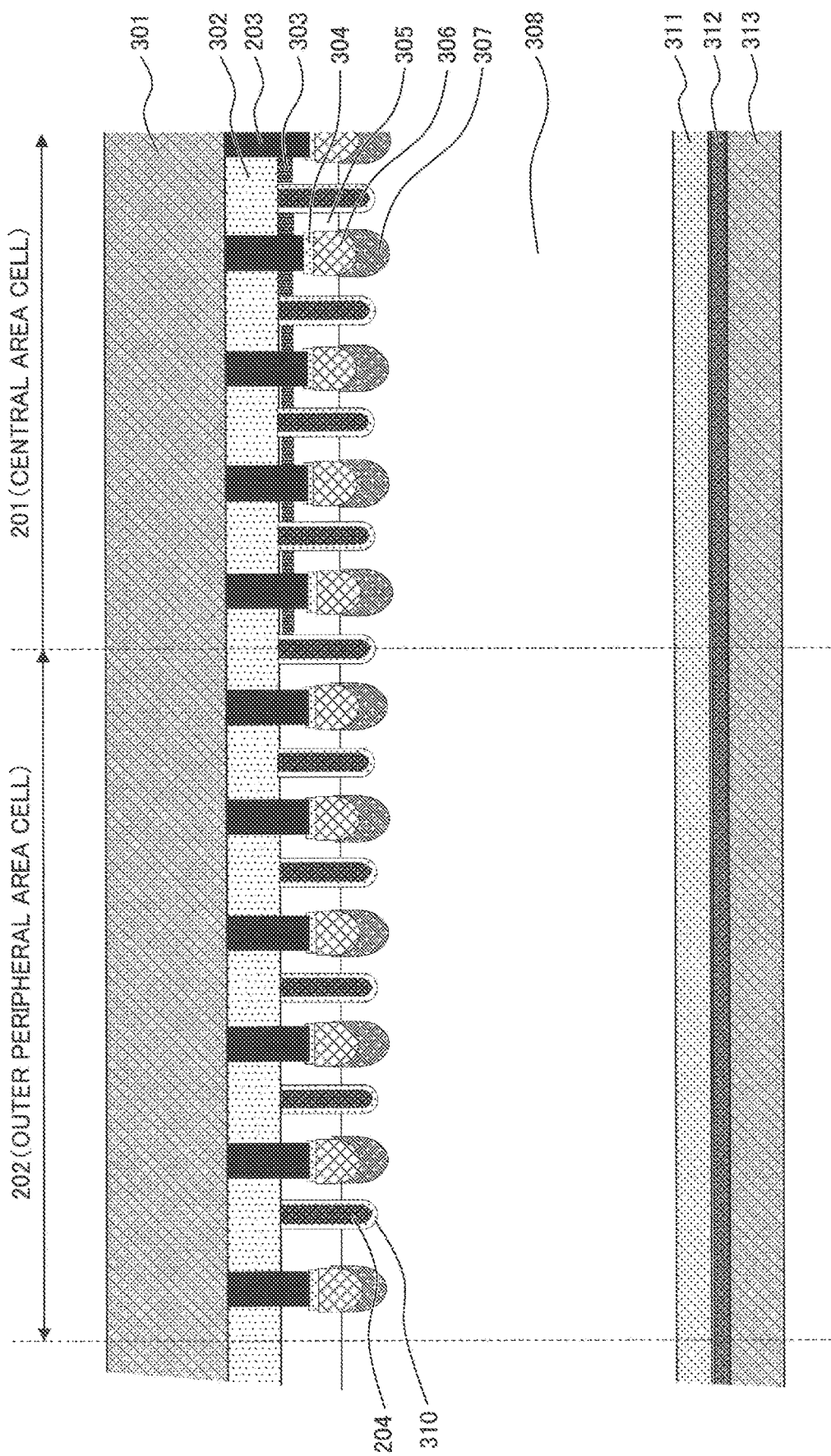
FIG. 11 is a cross-sectional view of an IGBT semiconductor chip according to a third embodiment of the invention.

A semiconductor device of a third embodiment of the invention will be described with reference to FIG. 11. FIG. 11 is a cross-sectional view of an IGBT semiconductor chip of the present embodiment, and corresponds to a modification of the second embodiment (FIG. 10).

The configuration of the central area cell 201 of the present embodiment is the same as that of the second embodiment (FIG. 10), and the repeated description will be omitted.

Meanwhile, as compared with the outer peripheral area cell 202 of the second embodiment (FIG. 10), the outer peripheral area cell 202 of the present embodiment is different from the configuration of the second embodiment (FIG. 10) in that the seventh semiconductor layer (the deep n layer) 307 of the second conductivity type formed in contact with a front surface of the sixth semiconductor layer (the deep p+ layer) 306 on the collector electrode 313 side and having a higher impurity concentration than the semiconductor substrate 308 is formed.

The present embodiment has an effect that the central area cell 201 and the outer peripheral area cell 202 both can form an electric field concentration pn junction by the sixth semiconductor layer (the deep p+ layer) 306 and the seventh semiconductor layer (the deep n layer) 307, uniformly generate electron injection by the impact ionization between the cells, equalize the hall current, and improve the cutoff resistance.

Meanwhile, since the outer peripheral area cell 202 does not include the third semiconductor layer (the n+ source layer) 303 as in the second embodiment (FIG. 10), there is no parasitic thyristor (the n+ source/p base/n− substrate/p-type collector layer) structure, and the latch-up can be prevented.

Since the outer peripheral area cell 202 does not include the third semiconductor layer (the n+ source layer) 303, no electron injection is performed at the time of turn-on, and a hole amount is smaller than that of the central area cell 201. Therefore, a hole density at the time of turn-off is also low, and the current concentration and latch-up can be prevented. As a result, it is possible to provide an IGBT semiconductor chip having excellent cutoff resistance.

Fourth Embodiment

Figure 12:
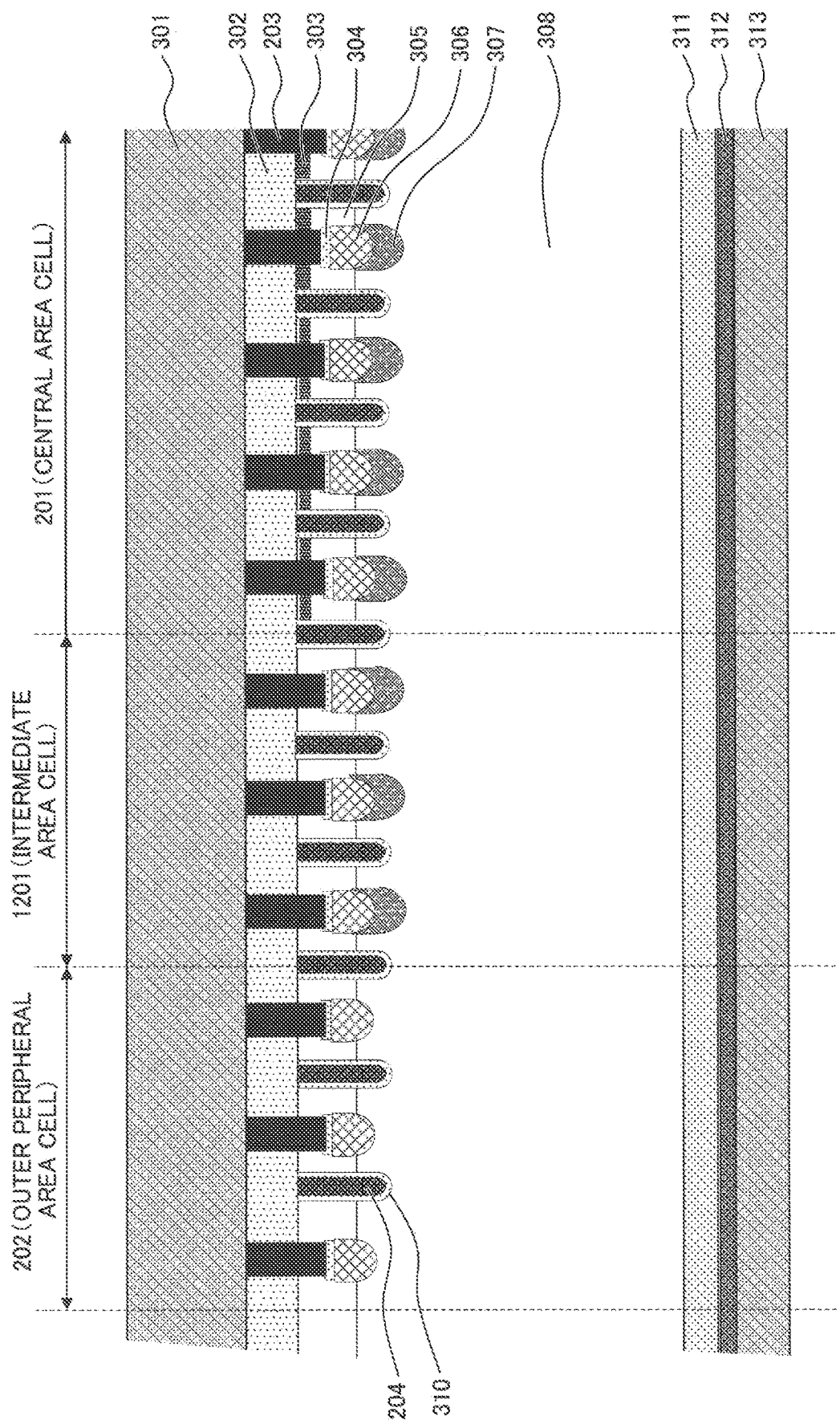
FIG. 12 is a cross-sectional view of an IGBT semiconductor chip according to a fourth embodiment of the invention.

A semiconductor device of a fourth embodiment of the invention will be described with reference to FIG. 12. FIG. 12 is a cross-sectional view of an IGBT semiconductor chip of the present embodiment, and corresponds to a modification of the second embodiment (FIG. 10).

The configurations of the central area cell 201 and the outer peripheral area cell 202 of the present embodiment are the same as that of the second embodiment (FIG. 10), and the repeated description will be omitted.

Meanwhile, the present embodiment is different from the configuration of the second embodiment (FIG. 10) in that an intermediate area cell 1201 is disposed at an intermediate position in the planar direction between the central area cell 201 and the outer peripheral area cell 202 of the IGBT semiconductor chip 101.

The configuration of the intermediate area cell 1201 of the present embodiment is the same as the configuration of the outer peripheral area cell 202 of the third embodiment (FIG. 11). Therefore, in the intermediate area cell 1201, the seventh semiconductor layer (the deep n layer) 307 of the second conductivity type formed in contact with the front surface of the sixth semiconductor layer (the deep p+ layer) 306 on the collector electrode 313 side and having a higher impurity concentration than the semiconductor substrate 308 is formed. In addition, the third semiconductor layer (the n+ source layer) 303 is not formed in an area between the emitter contact 203 and the gate insulating film 310.

The present embodiment has an effect that the central area cell 201 and the intermediate area cell 1201 both can form an electric field concentration pn junction by the sixth semiconductor layer (the deep p+ layer) 306 and the seventh semiconductor layer (the deep n layer) 307, uniformly generate electron injection by the impact ionization between the cells, equalize the hall current, and improve the cutoff resistance.

In particular, the present embodiment has an effect that since the intermediate area cell 1201 does not include the third semiconductor layer (the n+ source layer) 303, the impact ionized carrier is extracted in a structure without the parasitic thyristor (the n+ source/p base/n− substrate/p-type collector layer), a difference in the carrier density that occurs between the central area cell 201 and the outer peripheral area cell 202 is alleviated, and the local current concentration is suppressed.

In addition, the outer peripheral area cell 202 has a structure in which the hall current added from the chip termination guard ring area 102 can be efficiently extracted by eliminating the seventh semiconductor layer (the deep n layer) 307, and there is an effect that the current concentration in the outer peripheral area cell 202 can also be suppressed.

In addition, since the intermediate area cell 1201 and the outer peripheral area cell 202 both do not include the third semiconductor layer (the n+ source layer) 303, there is no parasitic thyristor (the n+ source/p base/n− substrate/p-type collector layer), and the latch-up can be prevented. As a result, it is possible to provide an IGBT semiconductor chip having excellent cutoff resistance.

Fifth Embodiment

Figure 13:
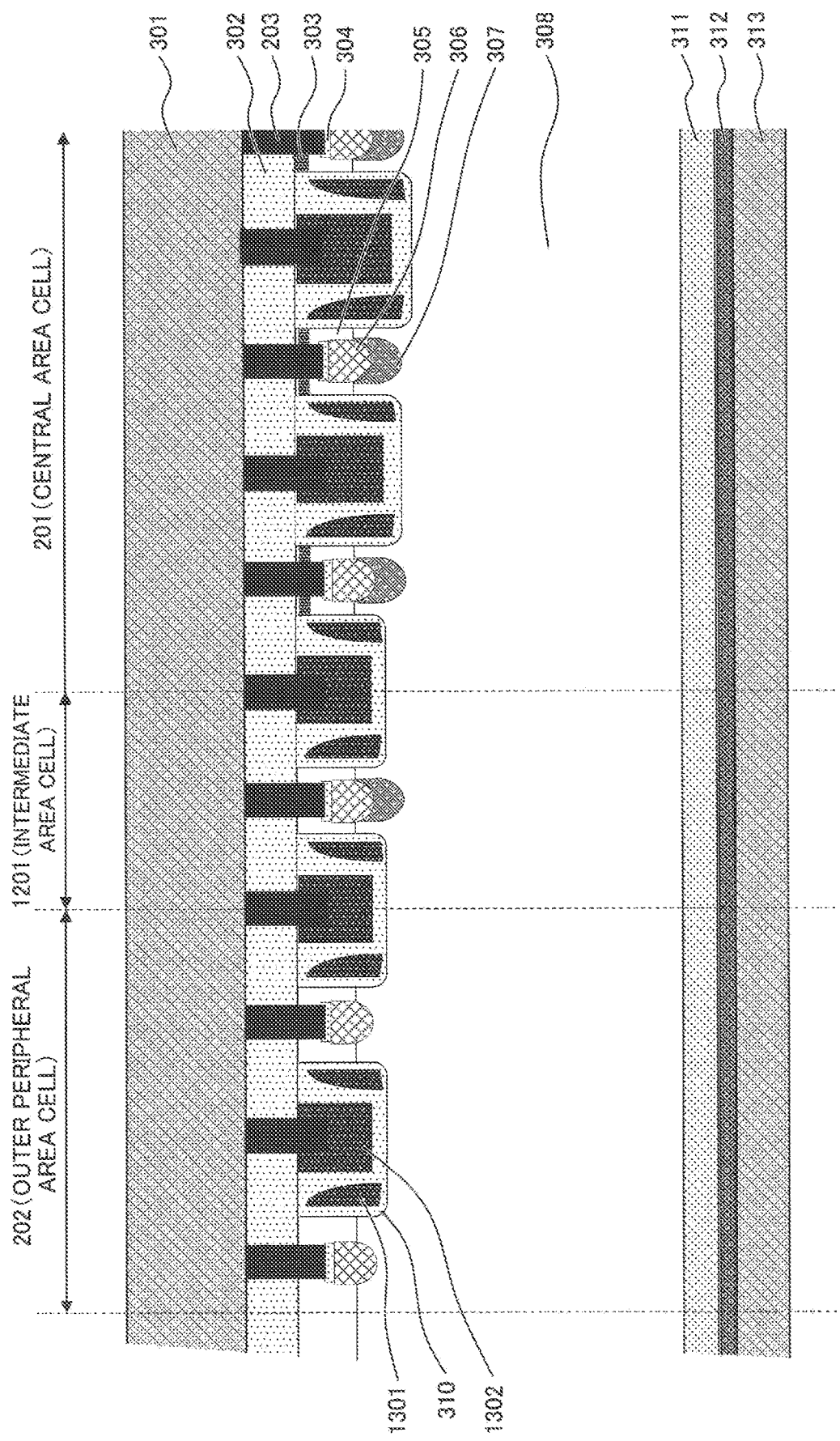
FIG. 13 is a cross-sectional view of an IGBT semiconductor chip according to a fifth embodiment of the invention.

A semiconductor device of a fifth embodiment of the invention will be described with reference to FIG. 13. FIG. 13 is a cross-sectional view of an IGBT semiconductor chip of the present embodiment, and corresponds to a modification of the fourth embodiment (FIG. 12).

In the IGBT semiconductor chip of the present embodiment, the basic configuration is the same as that of the fourth embodiment (FIG. 12) in that the intermediate area cell 1201 is disposed at the intermediate position in the planar direction between the central area cell 201 and the outer peripheral area cell 202 and the like, and the repeated description will be omitted.

In the fourth embodiment (FIG. 12), the gate electrode is formed by a trench structure (the trench gate 204 and the gate insulating film 310) in all the areas of the central area cell 201, the outer peripheral area cell 202, and the intermediate area cell 1201, whereas in the present embodiment (FIG. 13), the gate electrode is formed by a side gate structure (a side gate 1301, a Poly-Si field plate 1302, and the gate insulating film 310) in all the areas of the central area cell 201, the outer peripheral area cell 202, and the intermediate area cell 1201, which is different from the configuration of the fourth embodiment (FIG. 12).

As shown in FIG. 13, the gate electrode of the present embodiment is configured with a trench formed between the emitter electrode 301 and the semiconductor substrate 308, a gate electrode (the side gate 1301) formed inside the trench and insulated from the emitter electrode 301 via an insulating layer (the interlayer insulating film 302), and the Poly-Si field plate 1302 formed inside the trench and connected to the emitter electrode 301 via the emitter contact 203.

In the present embodiment, the IGBT cell is formed by the side gate structure, the feedback capacitance is small, and high switching and low loss can be achieved.

In addition, the effect due to the fact that the central area cell 201 and the intermediate area cell 1201 both form an electric field concentrated pn junction by the sixth semiconductor layer (the deep p+ layer) 306 and the seventh semiconductor layer (the deep n layer) 307, the effect due to the fact that the seventh semiconductor layer (the deep n layer) 307 is not included in the outer peripheral area cell 202, and the effect due to the fact that the third semiconductor layer (the n+ source layer) 303 is not included in both the intermediate area cell 1201 and the outer peripheral area cell 202 are the same as in the fourth embodiment (FIG. 12).

The side gate structure of the present embodiment can be similarly applied to all the embodiments including sixth to tenth embodiments to be described later.

Sixth Embodiment

Figure 14:
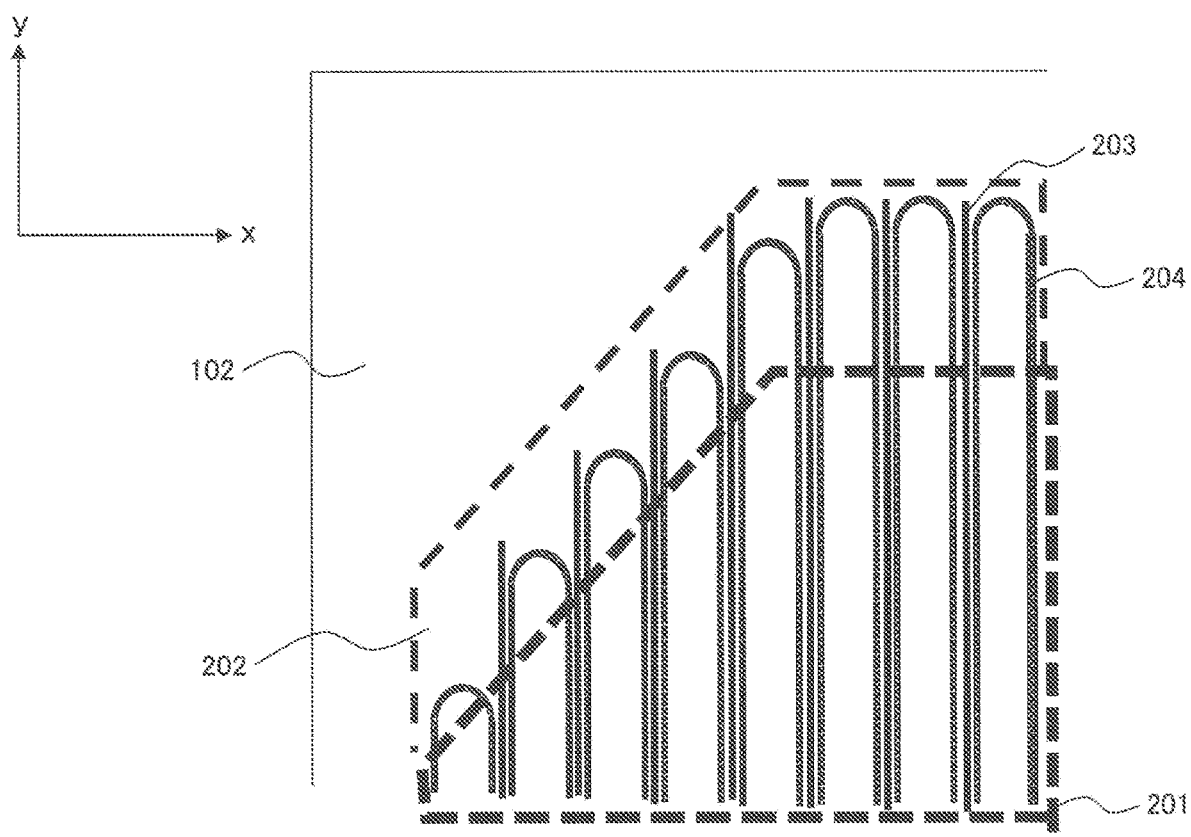
FIG. 14 is a top view of a cell termination area of an IGBT semiconductor chip according to a sixth embodiment of the invention.
Figure 15:
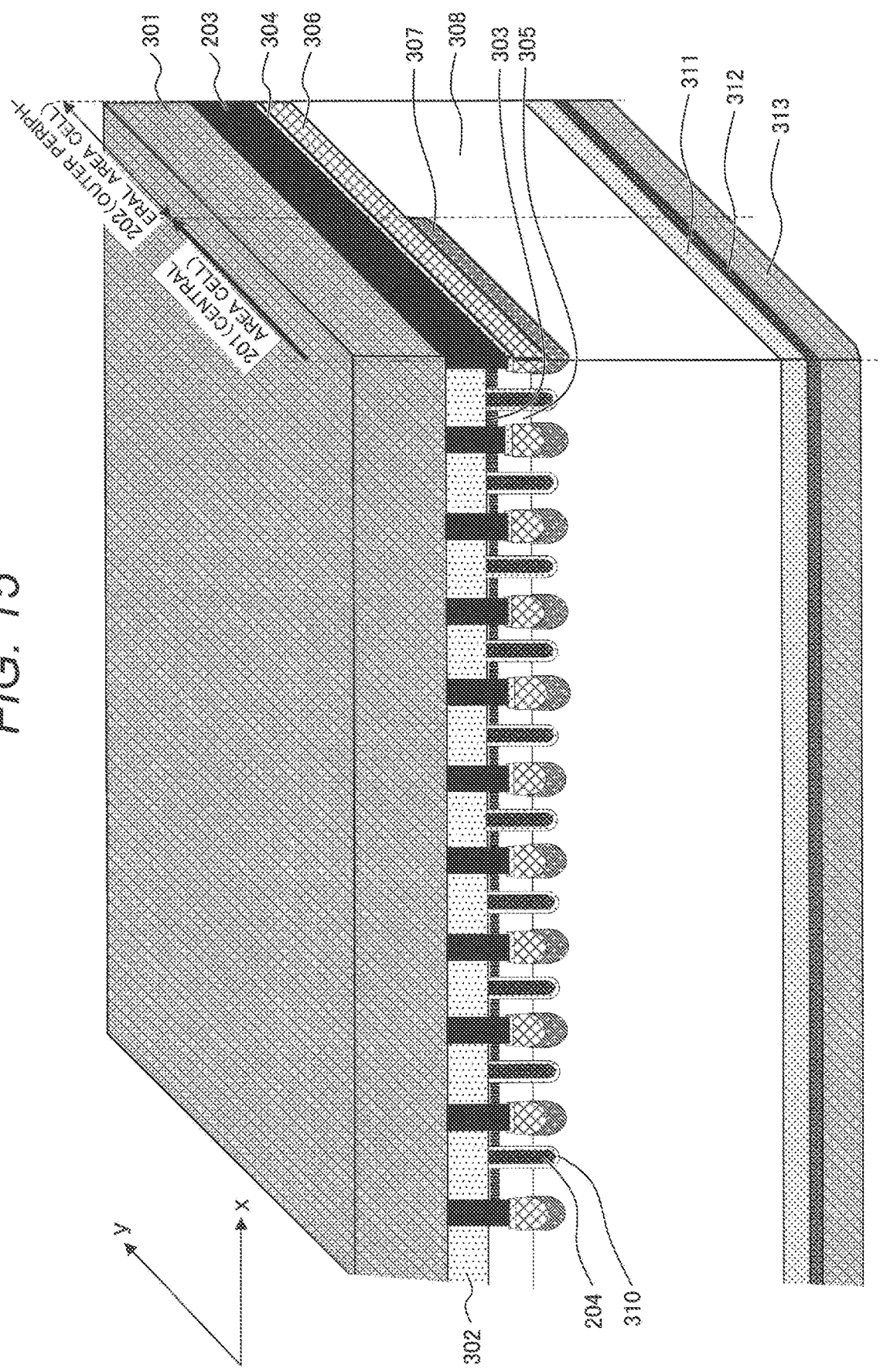
FIG. 15 is a bird's eye view of the IGBT semiconductor chip according to the sixth embodiment of the invention.

A semiconductor device of a sixth embodiment of the invention will be described with reference to FIGS. 14 and 15. FIG. 14 is a top view of a cell termination area (reference numeral 105 in FIG. 1A) of an IGBT semiconductor chip of the present embodiment. Trench gates of a unit cell of the IGBT are disposed in a stripe shape. FIG. 15 is a bird's eye view of the IGBT semiconductor chip of the present embodiment.

In the present embodiment, as shown in FIG. 14, stripe-shaped trench gates 204 are arranged in a y direction, and the outer peripheral area cell 202 is formed. The central area cell 201 has the same structure as that in the first embodiment (FIG. 2) and the fifth embodiment (FIG. 13).

The outer peripheral area cell 202 has the same structure as in the first embodiment (FIG. 2) and the second embodiment (FIG. 10). Even when the IGBT cells are disposed in a stripe shape, as shown in FIG. 15, the present embodiment has an effect that since the central area cell 201 and the outer peripheral area cell 202 are disposed in a depth direction of the trench, an electric field concentration pn junction can be formed by the sixth semiconductor layer (the deep p+ layer) 306 and the seventh semiconductor layer (the deep n layer) 307, the electron injection by the impact ionization can be uniformly generated between the cells, the hall current can be equalized, and the cutoff resistance can be improved.

In addition, the outer peripheral area cell 202 has a structure in which the hall current added from the chip termination guard ring area 102 can be efficiently extracted by eliminating the seventh semiconductor layer (the deep n layer) 307, and there is an effect that the current concentration in the outer peripheral area cell 202 can also be suppressed.

In addition, since the outer peripheral area cell 202 does not include the third semiconductor layer (the n+ source layer) 303, there is no parasitic thyristor (the n+ source/p base/n− substrate/p-type collector layer), and the latch-up can be prevented. As a result, it is possible to provide an IGBT semiconductor chip having excellent cutoff resistance.

Seventh Embodiment

Figure 16:
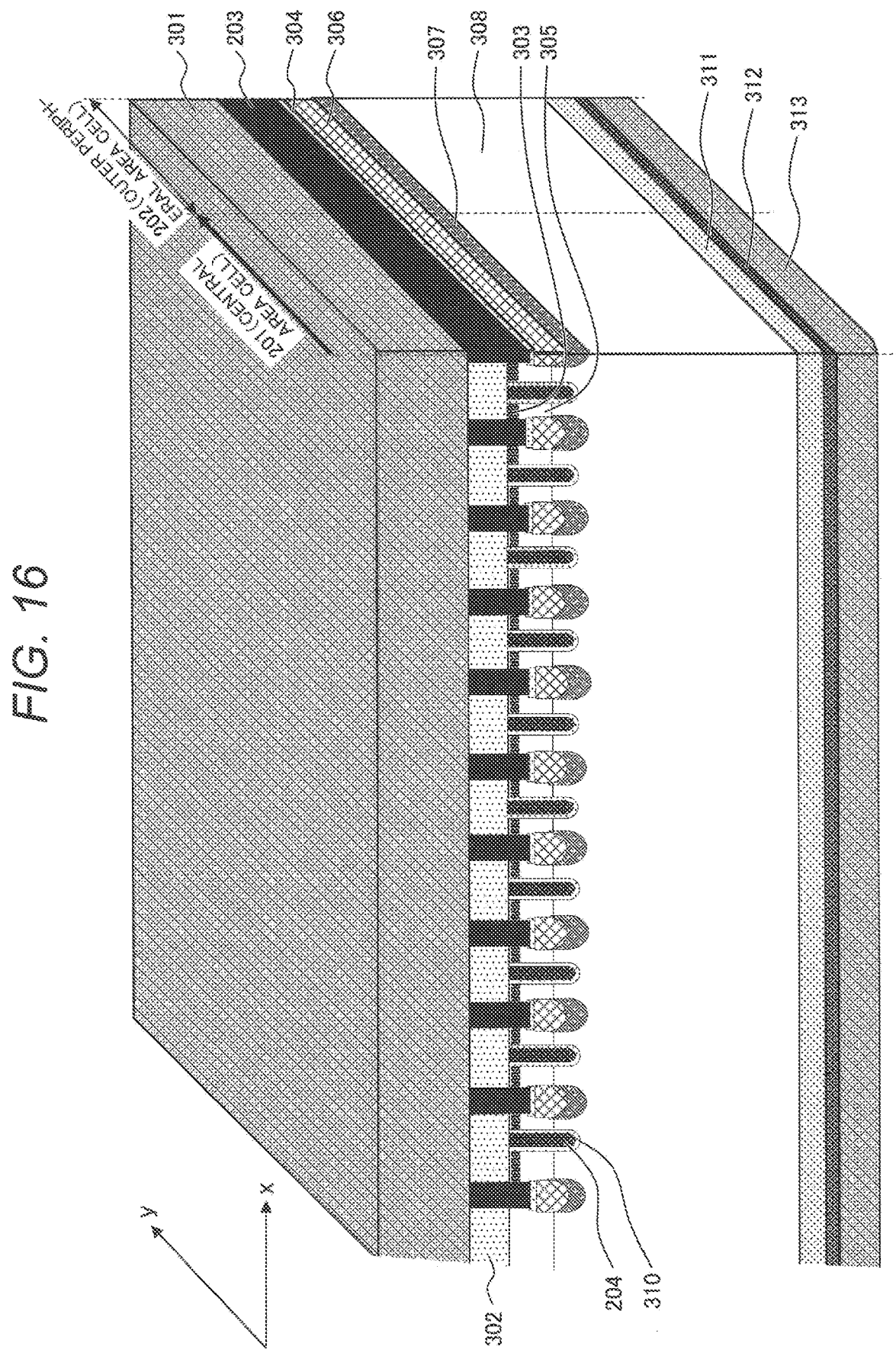
FIG. 16 is a bird's eye view of an IGBT semiconductor chip according to a seventh embodiment of the invention.

A semiconductor device of a seventh embodiment of the invention will be described with reference to FIG. 16. FIG. 16 is a bird's eye view of an IGBT semiconductor chip of the present embodiment, and corresponds to a modification of the sixth embodiment (FIG. 15). Trench gates of a unit cell of the IGBT are disposed in a stripe shape.

In the present embodiment, as shown in FIG. 16, the outer peripheral area cell 202 similar to that of the third embodiment (FIG. 11) is configured in the depth direction of the trench. Even when the IGBT cells are disposed in a stripe shape, the present embodiment has an effect that the central area cell 201 and the outer peripheral area cell 202 both can form an electric field concentration pn junction by the sixth semiconductor layer (the deep p+ layer) 306 and the seventh semiconductor layer (the deep n layer) 307, uniformly generate electron injection by the impact ionization between the cells, equalize the hall current, and improve the cutoff resistance.

Meanwhile, since the outer peripheral area cell 202 does not include the third semiconductor layer (the n+ source layer) 303 as in the third embodiment (FIG. 11), there is no parasitic thyristor (the n+ source/p base/n− substrate/p-type collector layer) structure, and the latch-up can be prevented.

Since the outer peripheral area cell 202 does not include the third semiconductor layer (the n+ source layer) 303, no electron injection is performed at the time of turn-on, and the hole amount is smaller than that of the central area cell 201. Therefore, the hole density at the time of turn-off is also low, and the current concentration and latch-up can be prevented. As a result, it is possible to provide an IGBT semiconductor chip having excellent cutoff resistance.

Eighth Embodiment

Figure 17:
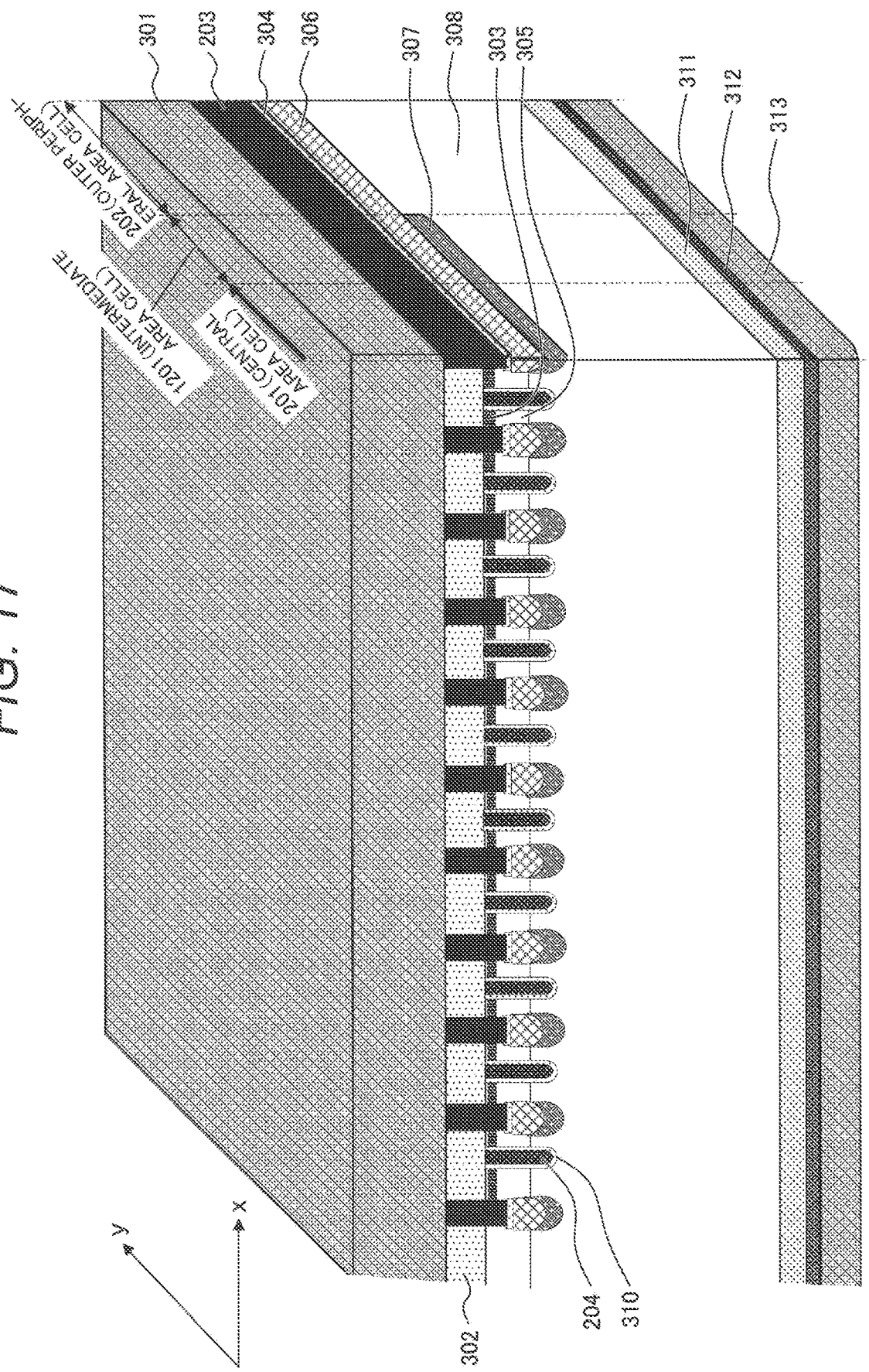
FIG. 17 is a bird's eye view of an IGBT semiconductor chip according to an eighth embodiment of the invention.

A semiconductor device of an eighth embodiment of the invention will be described with reference to FIG. 17. FIG. 17 is a bird's eye view of an IGBT semiconductor chip of the present embodiment, and corresponds to a modification of the seventh embodiment (FIG. 16). Trench gates of a unit cell of the IGBT are disposed in a stripe shape.

Even when the IGBT cells are disposed in a stripe shape, the present embodiment has an effect that as in the fourth embodiment (FIG. 12), in the depth direction, the central area cell 201 and the intermediate area cell 1201 both can form an electric field concentration pn junction by the sixth semiconductor layer (the deep p+ layer) 306 and the seventh semiconductor layer (the deep n layer) 307, uniformly generate electron injection by the impact ionization between the cells, equalize the hall current, and improve the cutoff resistance.

In particular, the present embodiment has an effect that since the intermediate area cell 1201 does not include the third semiconductor layer (the n+ source layer) 303, the impact ionized carrier is extracted in a structure without the parasitic thyristor (the n+ source/p base/n− substrate/p-type collector layer), the difference in the carrier density that occurs between the central area cell 201 and the outer peripheral area cell 202 is alleviated, and the local current concentration is suppressed.

In addition, the outer peripheral area cell 202 has a structure in which the hall current added from the chip termination guard ring area 102 can be efficiently extracted by eliminating the seventh semiconductor layer (the deep n layer) 307, and there is an effect that the current concentration in the outer peripheral area cell 202 can also be suppressed.

In addition, since the intermediate area cell 1201 and the outer peripheral area cell 202 both do not include the third semiconductor layer (the n+ source layer) 303, there is no parasitic thyristor (the n+ source/p base/n− substrate/p-type collector layer), and the latch-up can be prevented. As a result, it is possible to provide an IGBT semiconductor chip having excellent cutoff resistance.

Ninth Embodiment

Figure 18:
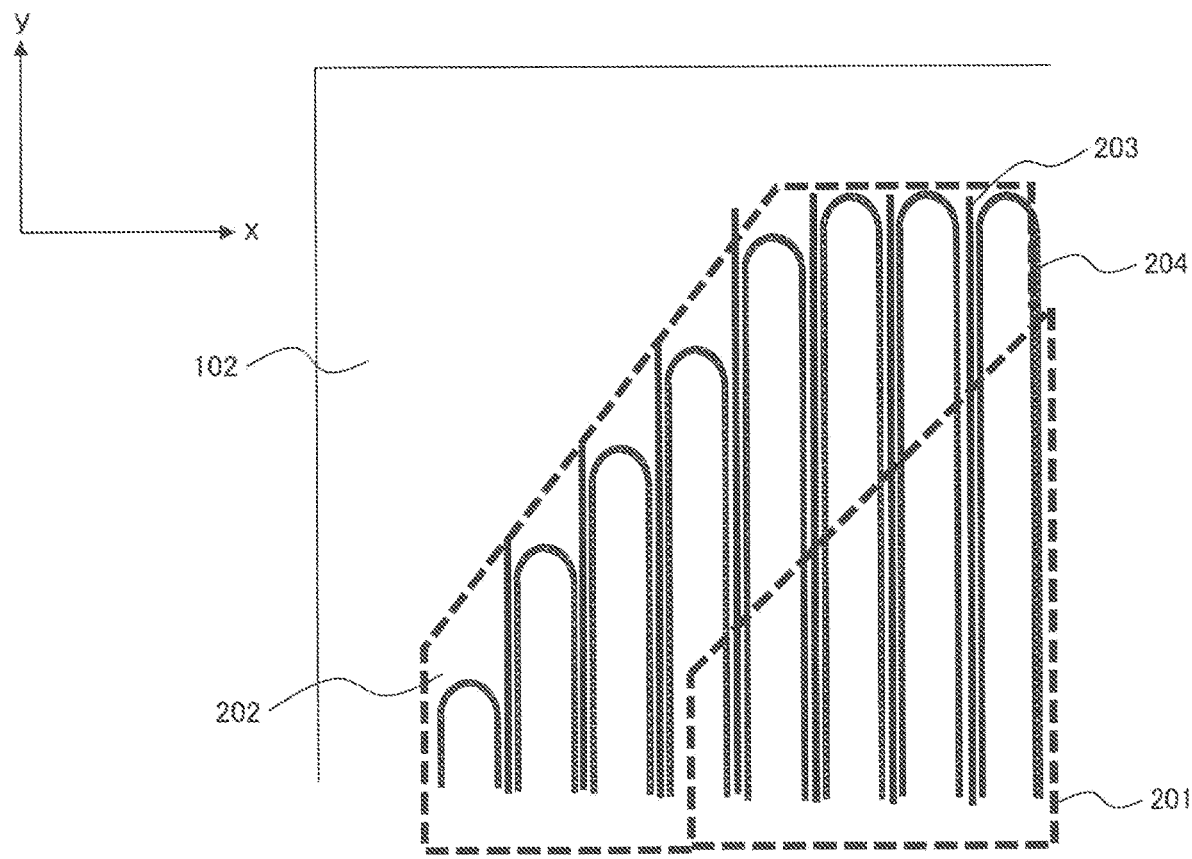
FIG. 18 is a top view of a cell termination area of an IGBT semiconductor chip according to a ninth embodiment of the invention.
Figure 19:
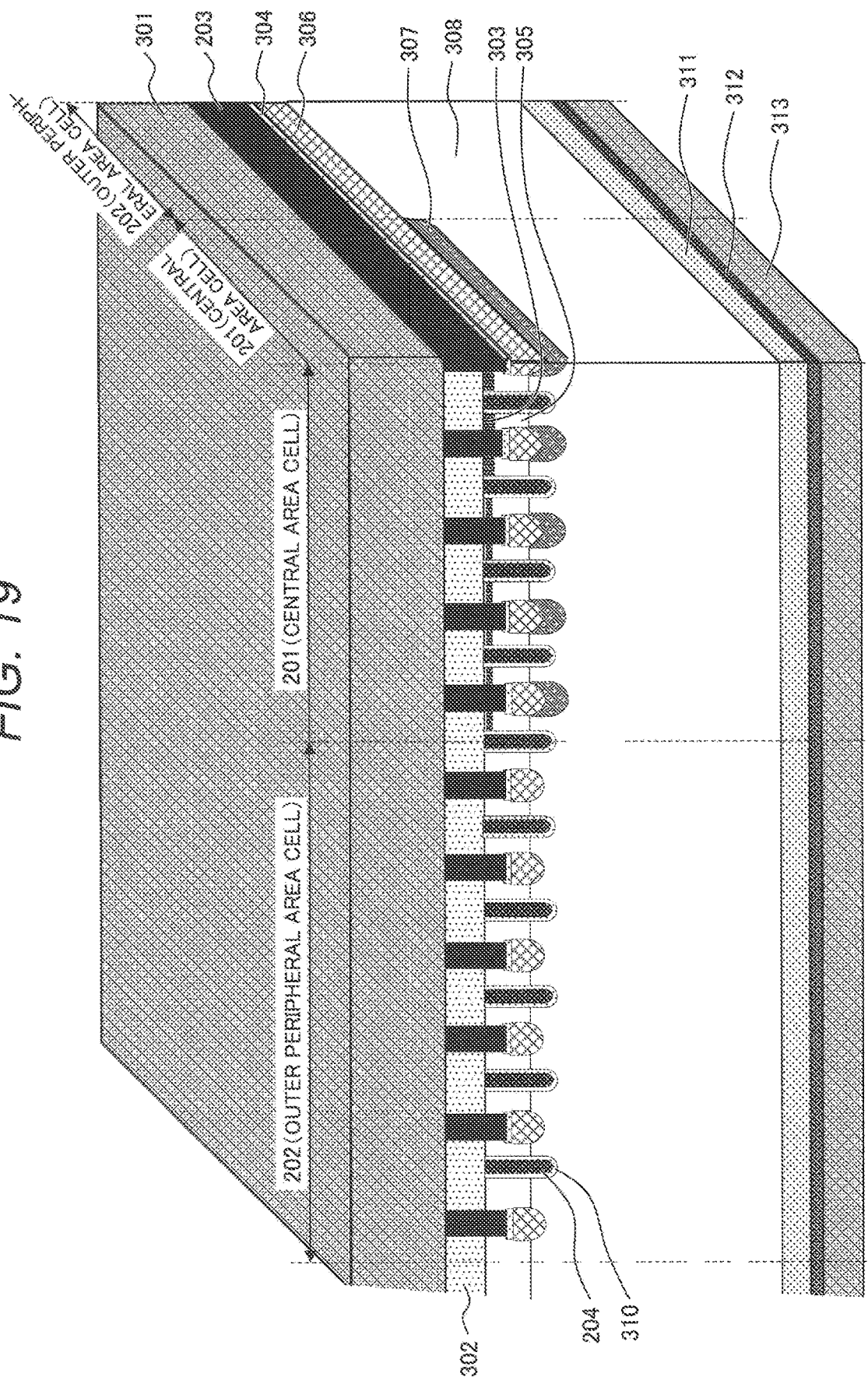
FIG. 19 is a bird's eye view of the IGBT semiconductor chip according to the ninth embodiment of the invention.

A semiconductor device of a ninth embodiment of the invention will be described with reference to FIGS. 18 and 19. FIG. 18 is a top view of the cell termination area (reference numeral 105 in FIG. 1A) of an IGBT semiconductor chip of the present embodiment. Trench gates of a unit cell of the IGBT are disposed in a stripe shape. FIG. 19 is a bird's eye view of the IGBT semiconductor chip of the present embodiment.

Even when the IGBTs are disposed in a stripe shape, the present embodiment has an effect that the central area cell 201 and the outer peripheral area cell 202 are disposed in both the y direction and the x direction, and in the central area cell 201, an electric field concentration pn junction can be formed by the sixth semiconductor layer (the deep p+ layer) 306 and the seventh semiconductor layer (the deep n layer) 307, electron injection by the impact ionization can be uniformly generated between the cells, the hall current can be equalized, and the cutoff resistance can be improved.

Meanwhile, the outer peripheral area cell 202 has a structure in which the hall current added from the chip termination guard ring area 102 can be efficiently extracted by eliminating the seventh semiconductor layer (the deep n layer) 307, and there is an effect that the current concentration in the outer peripheral area cell 202 can also be suppressed.

In addition, since the outer peripheral area cell 202 does not include the third semiconductor layer (the n+ source layer) 303, there is no parasitic thyristor (the n+ source/p base/n− substrate/p-type collector layer), and the latch-up can be prevented. As a result, it is possible to provide an IGBT semiconductor chip having excellent cutoff resistance.

Tenth Embodiment

Figure 20:
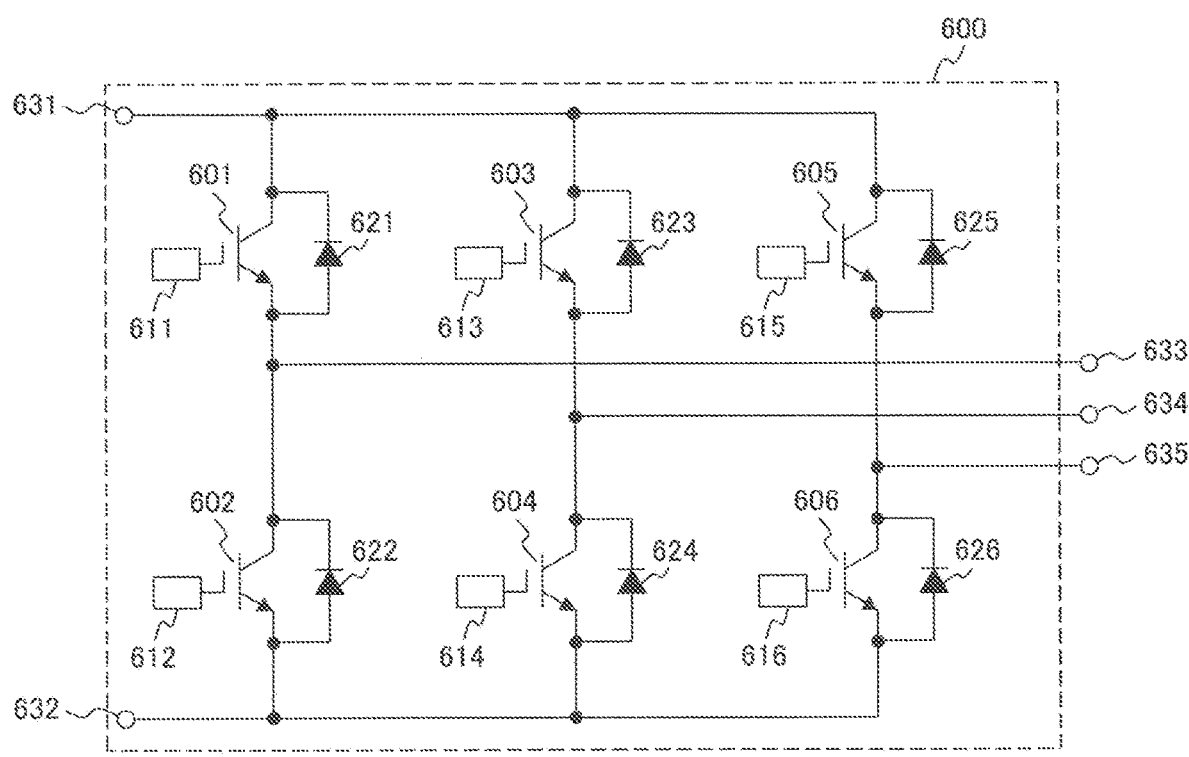
FIG. 20 is a circuit block diagram of a power conversion device according to a tenth embodiment of the invention.

An example of an embodiment in which the semiconductor device of the invention is applied to a power conversion device will be described with reference to FIG. 20. FIG. 20 is a circuit block diagram showing a power conversion device 600 that employs the semiconductor devices according to the first to ninth embodiments of the invention as components. FIG. 20 shows a circuit configuration of the power conversion device 600 according to the present embodiment, and a relation of connection between the DC power supply and a three-phase AC motor (AC load).

In the power conversion device 600 according to the present embodiment, the semiconductor devices according to the first to ninth embodiments are used as power switching elements 601 to 606. The power switching elements 601 to 606 are, for example, IGBTs.

As shown in FIG. 20, the power conversion device 600 of the present embodiment includes a P terminal 631 and an N terminal 632, which are a pair of DC terminals, and a U terminal 633, a V terminal 634, and a W terminal 635, which are the same number of AC terminals as the number of phases of AC output.

A switching leg is provided in which a pair of power switching elements 601, 602 are connected in series and the U terminal 633 connected to a series connection point thereof is used as an output. Similarly to the above, a switching leg is provided in which power switching elements 603, 604 are connected in series and the V terminal 634 connected to a series connection point thereof is used as an output. In addition, similarly to the above, a switching leg is provided in which power switching elements 605, 606 are connected in series and the W terminal 635 connected to a series connection point thereof is used as an output.

The three-phase switching legs composed of the power switching elements 601 to 606 are connected between the DC terminals of the P terminal 631 and the N terminal 632, and is supplied with DC power from a DC power supply (not shown). The U terminal 633, V terminal 634, and W terminal 635, which are three-phase AC terminals of the power conversion device 600, are connected to a three-phase AC motor (not shown) as a three-phase AC power supply.

Diodes 621 to 626 are connected in antiparallel to the power switching elements 601 to 606, respectively. Gate input terminals of the power switching elements 601 to 606 composed of the IGBTs are respectively connected to gate drive circuits 611 to 616, and are respectively driven and controlled by the gate drive circuits 611 to 616.

That is, the power conversion device 600 of the present embodiment is a power conversion device that inputs DC power from the outside, converts the input DC power into AC power, and outputs the AC power. The power conversion device 600 includes the pair of DC terminals 631, 632 for inputting DC power, and the AC terminals 633 to 635 that are AC terminals for outputting AC power, the number of which is the same number as the number of phases of AC related to the AC power. For each of the AC terminals 633 to 635 corresponding to the number of phases, between one terminal (the P terminal 631) and the other terminal (the N terminal 632) of the pair of DC terminals 631, 632, a series circuit (for example, a series circuit of a parallel circuit of the power switching element 601 and the diode 621 and a parallel circuit of the power switching element 602 and the diode 622) with a configuration in which two parallel circuits (for example, a parallel circuit of the power switching element 601 and the diode 621), in each of which a switching element (for example, the power switching element 601) and a diode (for example, the diode 621) having polarity reverse to that of the switching element are connected in parallel, are connected in series is connected, and an interconnection point of the two parallel circuits configuring the series circuit is connected to the AC terminal (for example, the U terminal 633) of the phase (for example, U phase) corresponding to the series circuit.

According to the IGBT semiconductor chip 101 described in each of the above first to ninth embodiments, the local current/electric field concentration and current concentration at a chip termination portion due to an electric field variation between IGBT cells due to a shape variation and impurity variation during manufacturing can be suppressed, and the cutoff resistance can be improved.

Therefore, the IGBT semiconductor chips 101 of each of the first to ninth embodiments make it possible to increase the current density of the IGBT chip, and to realize the miniaturization of the power conversion device in which the IGBT chip is mounted.

The invention is not limited to the embodiments described above and includes various modifications. For example, the above embodiments have been described in detail for easy understanding of the invention, and are not necessarily limited to those including all the configurations described above. A part of the configuration of one embodiment can be replaced with the configuration of another embodiment, and the configuration of one embodiment can also be added to the configuration of another embodiment. In addition, other configurations may be added to, deleted from, or replaced with a part of the configuration of each embodiment.

REFERENCE SIGN LIST

101 . . . IGBT semiconductor chip, 102 . . . chip termination guard ring area, 103 . . . cell area, 104 . . . gate electrode PAD, 105 . . . cell termination area, 201 . . . central area cell, 202 . . . outer peripheral area cell, 203 . . . emitter contact, 204 . . . trench gate, 301 . . . emitter electrode, 302 . . . interlayer insulating film, 303 . . . third semiconductor layer (n+ source layer), 304 . . . fourth semiconductor layer (shallow p+ layer), 305 . . . fifth semiconductor layer (p base layer), 306 . . . sixth semiconductor layer (deep p+ layer), 307 . . . seventh semiconductor layer (deep n layer), 308 . . . semiconductor substrate (n- semiconductor substrate), 310 . . . gate insulating film, 311 . . . second semiconductor layer (n-type buffer layer), 312 . . . first semiconductor layer (p-type collector layer), 313 . . . collector electrode, 501 . . . trench, 502 . . . contact hole, 503 . . . resist, 600 . . . power conversion device, 601 to 606 . . . power switching device, 621 to 626 . . . diode, 611 to 616 . . . gate drive circuit, 631, 632 . . . DC terminal, 633 to 635 . . . AC terminal, 1201 . . . intermediate area cell, 1301 . . . side gate, 1302 . . . Poly-Si field plate

The invention claimed is:

1. A semiconductor device, comprising:
   an emitter electrode formed on a front surface of a semiconductor substrate via an interlayer insulating film;
   a collector electrode formed on a back surface of the semiconductor substrate;
   a first semiconductor layer of a first conductivity type in contact with the collector electrode and formed on the back surface of the semiconductor substrate;
   a second semiconductor layer of a second conductivity type formed on the first semiconductor layer;
   a central area cell disposed along a front surface of the semiconductor substrate; and
   an outer peripheral area cell located outside the central area cell in a planar direction of the semiconductor substrate and disposed between the central area cell and a chip termination guard ring area, wherein
   the central area cell includes:
      a trench formed between the emitter electrode and the semiconductor substrate;
      a gate electrode formed inside the trench via a gate insulating film and insulated from the emitter electrode via the interlayer insulating film;
      a third semiconductor layer of a second conductivity type formed in contact with the gate insulating film and having a higher impurity concentration than the semiconductor substrate;
      a fourth semiconductor layer of a first conductivity type formed in contact with a semiconductor substrate side of the emitter electrode via an emitter contact and having a higher impurity concentration than the first semiconductor layer;
      a fifth semiconductor layer of a first conductivity type in contact with the gate insulating film, formed on the semiconductor substrate side of the third semiconductor layer, and having a lower impurity concentration than the fourth semiconductor layer;
      a sixth semiconductor layer of a first conductivity type in contact with a front surface of the fourth semiconductor layer on the semiconductor substrate side, formed so as to project from the fifth semiconductor layer toward the semiconductor substrate side, and having a lower carrier concentration than the fourth semiconductor layer; and
      a seventh semiconductor layer of a second conductivity type formed in contact with a front surface of the sixth semiconductor layer on a collector electrode side and having a higher impurity concentration than the semiconductor substrate, and
   the outer peripheral area cell includes the trench, the gate electrode, the fourth semiconductor layer, the fifth semiconductor layer, and the sixth semiconductor layer, and the outer peripheral area cell does not include at least one of the third semiconductor layer and the seventh semiconductor layer.

2. The semiconductor device according to claim 1, wherein
   the outer peripheral area cell includes a third semiconductor layer of a second conductivity type formed in contact with the gate insulating film and having a higher impurity concentration than the semiconductor substrate.

3. The semiconductor device according to claim 1, wherein
   the outer peripheral area cell includes a seventh semiconductor layer of a second conductivity type formed in contact with a front surface of the sixth semiconductor layer on the collector electrode side and having an higher impurity concentration than the semiconductor substrate and a lower impurity concentration than the second semiconductor layer.

4. The semiconductor device according to claim 1, further comprising:
   an intermediate area cell between the central area cell and the outer peripheral area cell in a planar direction of the semiconductor substrate, wherein
   the intermediate area cell includes the trench, the gate electrode, the fourth semiconductor layer, the fifth semiconductor layer, the sixth semiconductor layer, and the seventh semiconductor layer, and does not include the third semiconductor layer.

5. The semiconductor device according to claim 1, wherein
   the gate electrode is a trench gate electrode formed along a shape of the trench inside the trench.

6. The semiconductor device according to claim 1, wherein
   the gate electrode is a sidewall shaped side gate electrode formed along a side wall of the trench inside the trench, and
   a Poly-Si field plate connected to the emitter electrode via an emitter contact inside the trench is further provided.

7. The semiconductor device according to claim 1, wherein
   the gate electrode is disposed in a stripe shape in a plane direction of the semiconductor substrate.

8. A power conversion device, comprising:
   a pair of DC terminals;
   the same number of AC terminals as the number of phases of AC; and
   a switching leg that is connected between the pair of DC terminals and in which two parallel circuits of a switching element and a diode of opposite polarity are connected in series, wherein
   an interconnection point of parallel circuits constitutes the same number of power conversion units as the number of phases of AC connected to different AC terminals, and
   the switching element is the semiconductor device according to claim 1.

\* \* \* \* \*